US006829286B1

(12) United States Patent
Guilfoyle et al.

(10) Patent No.: US 6,829,286 B1
(45) Date of Patent: Dec. 7, 2004

(54) RESONANT CAVITY ENHANCED VCSEL/ WAVEGUIDE GRATING COUPLER

(75) Inventors: Peter Guilfoyle, Zephyr Cove, CA (US); Jongwoo Kim, Minden, NV (US)

(73) Assignee: Opticomp Corporation, Zephyr Cove, NV (US)

( * ) Notice: Subject to any disclaimer, the term of this patent is extended or adjusted under 35 U.S.C. 154(b) by 71 days.

(21) Appl. No.: 10/136,953

(22) Filed: May 1, 2002

Related U.S. Application Data

(63) Continuation of application No. 09/867,719, filed on May 29, 2001, now abandoned.
(60) Provisional application No. 60/207,525, filed on May 26, 2000.

(51) Int. Cl.$^7$ ............................................... H01S 3/00
(52) U.S. Cl. ...................................... 372/108; 372/96
(58) Field of Search ........................... 372/43–50, 108, 372/102, 96

(56) References Cited

U.S. PATENT DOCUMENTS

| 4,674,100 A | * | 6/1987 | Kobayashi | 372/96 |
| 4,743,083 A | * | 5/1988 | Schimpe | 385/37 |
| 5,003,550 A | * | 3/1991 | Welch et al. | 372/50 |
| 5,029,297 A | * | 7/1991 | Halemane et al. | 359/333 |
| 5,111,467 A | * | 5/1992 | Bradley | 372/32 |
| 5,771,254 A | * | 6/1998 | Baldwin et al. | 372/31 |
| 5,835,517 A | * | 11/1998 | Jayaraman et al. | 372/50 |
| 6,055,262 A | * | 4/2000 | Cox et al. | 372/96 |

* cited by examiner

*Primary Examiner*—Quyen Leung
(74) *Attorney, Agent, or Firm*—Gray Cary Ware & Freidenrich LLP

(57) ABSTRACT

An optical coupler comprises first and second mirrors. The first mirror is positioned with respect to the second mirror so that a resonant cavity is defined between them. A waveguide structure is positioned in the resonant cavity and includes a surface-normal grating structure. A thickness of the resonant cavity is selected so that a phase matching condition is satisfied for resonance in the resonant cavity. At least one of the first and second mirrors may be formed from a structure in an optoelectronic device. Alternatively, at least one of the first and second mirrors is formed from a semiconductor layer. At least one of the first and second mirrors may be formed as a semiconductor distributed bragg reflector, or as a dielectric distributed bragg reflector. At least one of the first and second mirrors may be a mirror in a vertical cavity surface emitting laser (VCSEL) structure. The surface-normal grating structure may be shaped so that first order modes of light incident upon the surface-normal grating structure are coupled into the waveguide while zero-order modes are reflected out into the resonant cavity and reflected by the mirror.

33 Claims, 22 Drawing Sheets

A resonant cavity enhanced (RCE) waveguide grating coupler

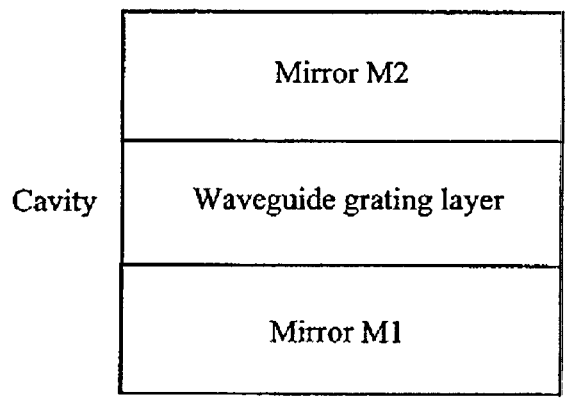
Figure 1: A resonant cavity enhanced (RCE) waveguide grating coupler
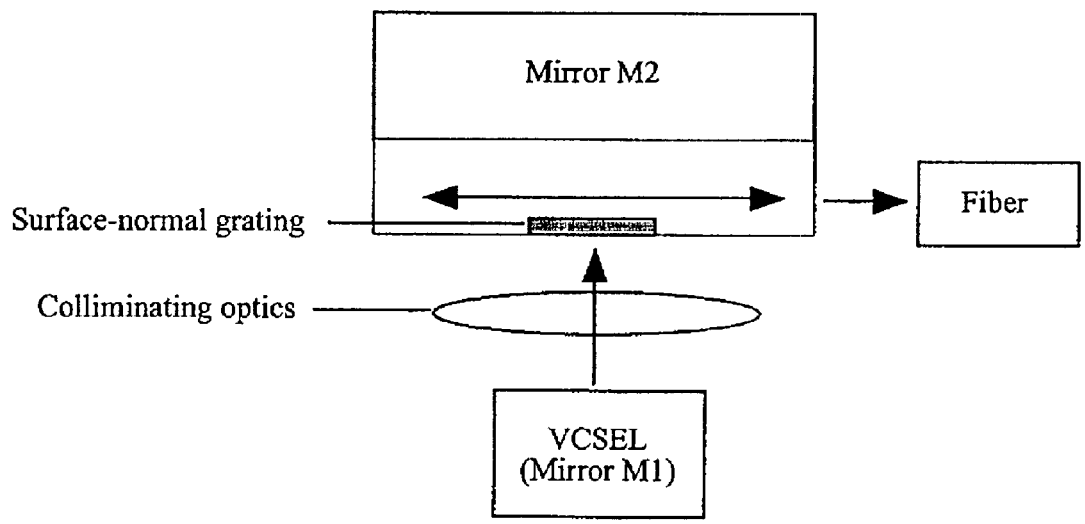
Figure 2: A hybrid RCE VCSEL/waveguide grating coupler

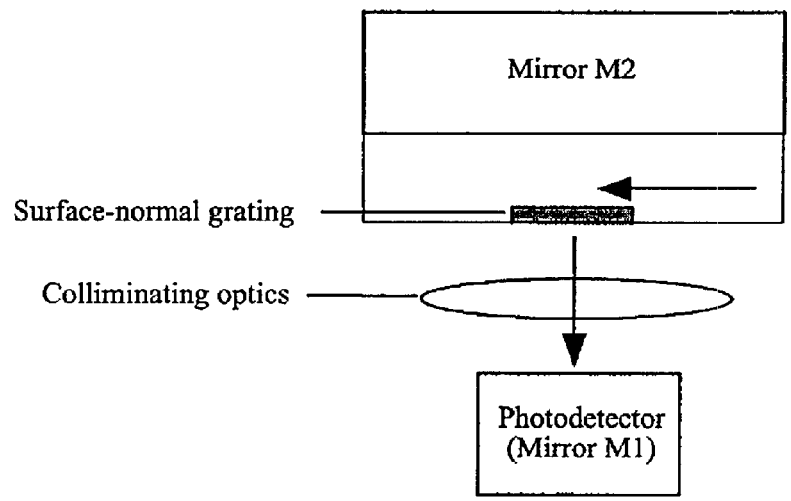
Figure 3: A hybrid RCE photodetector/waveguide grating coupler
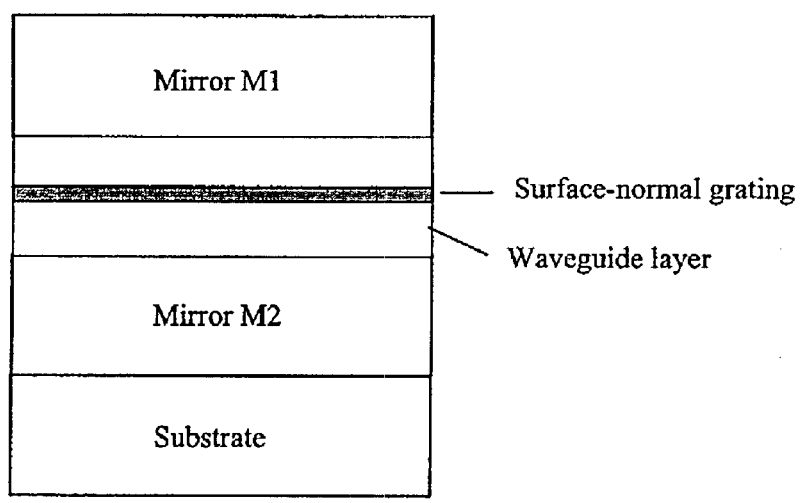
Figure 4: A monolithic RCE waveguide grating coupler.

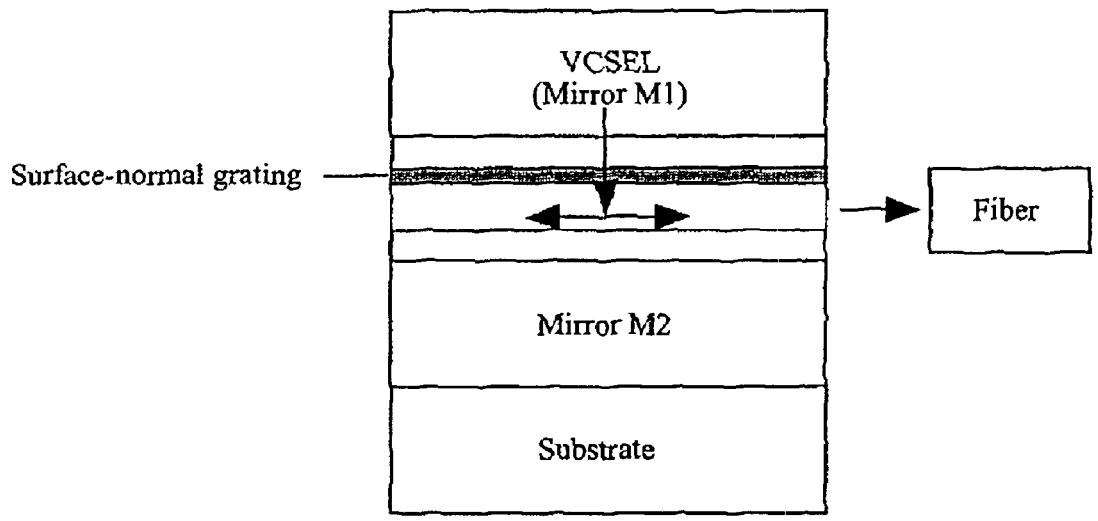
Figure 5: A monolithic RCE VCSEL/waveguide grating coupler fabricated using an epitaxial regrowth technique.
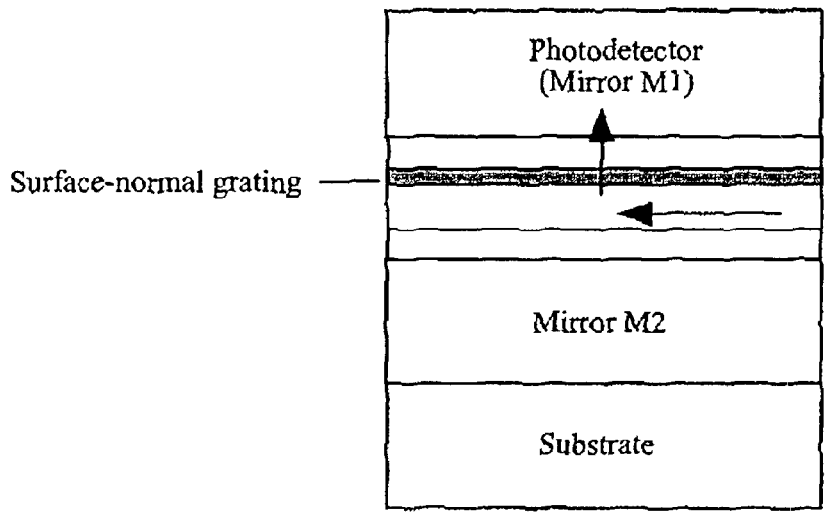
Figure 6: A monolithic RCE photodetector/waveguide grating coupler fabricated using an epitaxial regrowth technique.

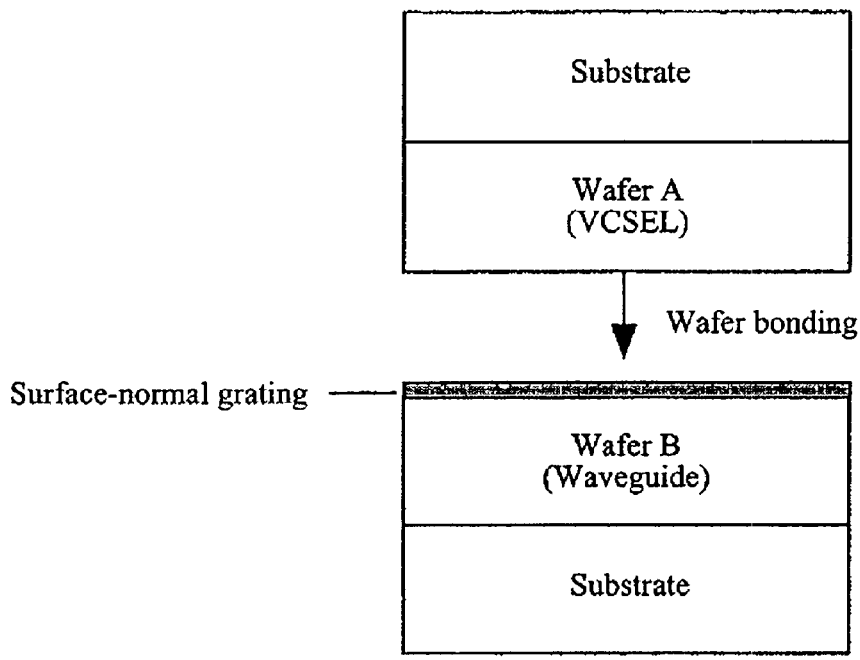
Figure 7: A monolithic RCE VCSEL/waveguide grating coupler fabricated using a wafer bonding technique.
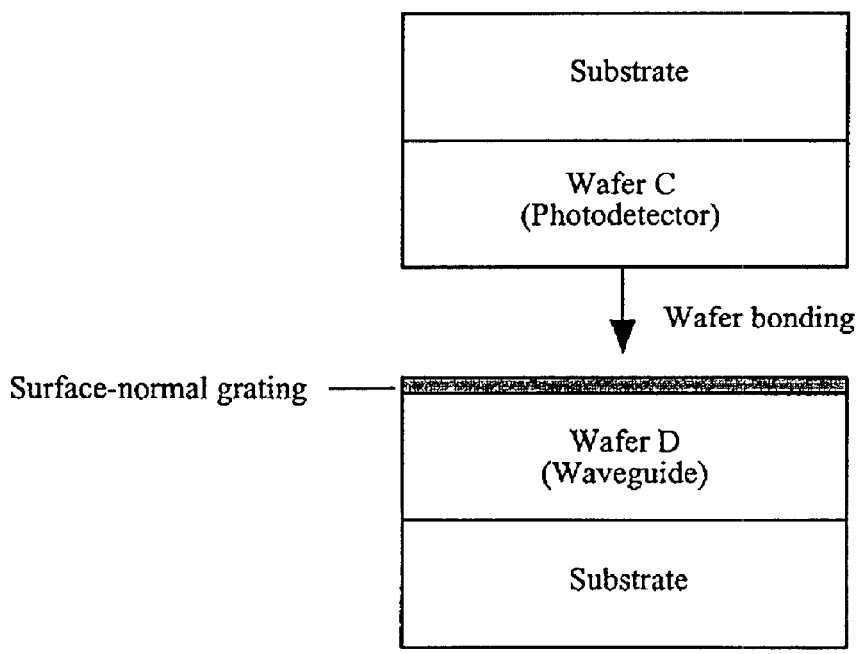
Figure 8: A monolithic RCE photodetector/waveguide grating coupler fabricated using a wafer bonding technique.

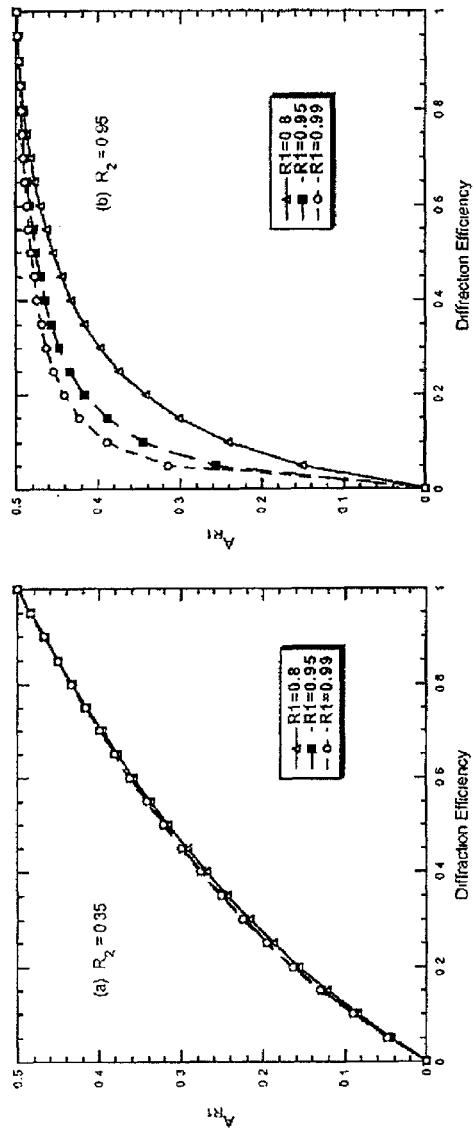
FIGURE 13A
FIGURE 13B
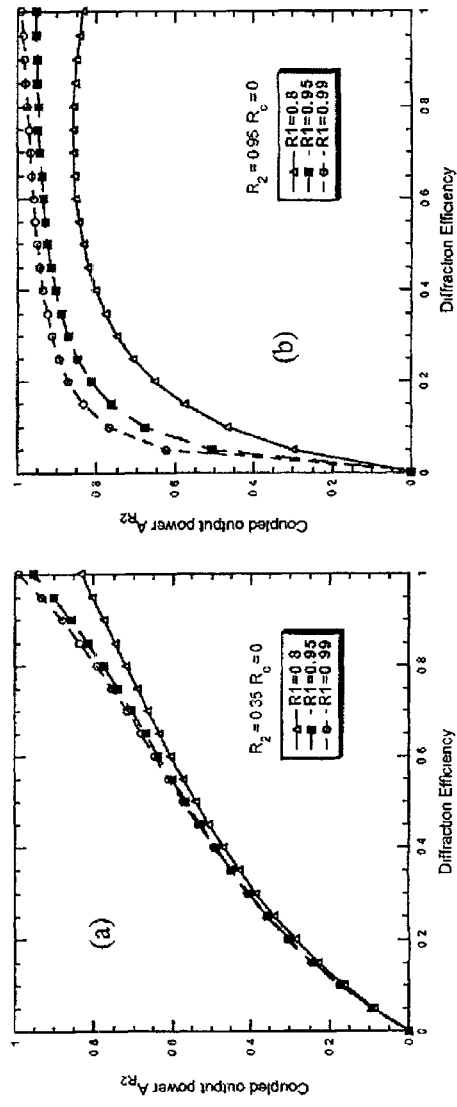
FIGURE 15A
FIGURE 15B

| Voltage | 4 v | 4.5 v | 5 v | 5.5 v | 6 v | 6.5 v |
|---------|-----|-------|-----|-------|-----|-------|
| Current | 4.5 mA | 5.55 mA | 6.63 mA | 7.73 mA | 8.85 mA | 9.95 mA |

Table 1: Voltages and currents that were applied to VCSELs.

|  | Peak Wavelengths at Various Voltages | | | | | |
| --- | --- | --- | --- | --- | --- | --- |
| VCSEL Location | 4v | 4.5v | 5v | 5.5v | 6v | 6.5v |
| VCSEL 1 | 843.41 nm | 844.94 nm | 845.24 nm | 845.59 nm | 845.96 nm | 846.41 nm |
| VCSEL 2 | 843.39 nm | 844.70 nm | 844.99 nm | 845.39 nm | 845.75 nm | 846.16 nm |
| VCSEL 3 | 844.30 nm | 844.56 nm | 844.92 nm | 845.28 nm | 845.68 nm | 846.07 nm |
| VCSEL 4 | 843.91 nm | 844.18 nm | 844.49 nm | 844.81 nm | 845.24 nm | 845.74 nm |
| VCSEL 5 | 843.47 nm | 843.73 nm | 843.93 nm | 844.37 nm | 844.65 nm | 845.13 nm |

Table 2: Peak wavelengths of the 1 x 5 VCSEL array.

FIGURE 29

|  | Mean Wavelengths at Various Voltages | | | | | |
| --- | --- | --- | --- | --- | --- | --- |
| VCSEL Location | 4v | 4.5v | 5v | 5.5v | 6v | 6.5v |
| VCSEL 1 | 844.87 nm | 844.70 nm | 845.15 nm | 845.50 nm | 845.68 nm | 846.09 nm |
| VCSEL 2 | 844.39 nm | 844.98 nm | 844.98 nm | 845.34 nm | 845.66 nm | 846.09 nm |
| VCSEL 3 | 844.79 nm | 844.57 nm | 844.92 nm | 845.28 nm | 845.68 nm | 846.05 nm |
| VCSEL 4 | 844.21 nm | 844.18 nm | 844.49 nm | 844.81 nm | 845.24 nm | 845.66 nm |
| VCSEL 5 | 843.63 nm | 843.80 nm | 843.93 nm | 844.37 nm | 844.65 nm | 845.13 nm |

Table 3 Mean wavelengths of the 1 x 5 VCSEL array.

FIGURE 30

| Layer | Material | Mole Fraction | Thickness | Doping |
|---|---|---|---|---|
| 5 | $Al_xGa_{1-x}As$ | x = 0.15 +/- 0.02 | 0.5 µm +/- 0.02 µm | undoped |
| 4 | $Al_xGa_{1-x}As$ | x = 0.4 +/- 0.02 | 2.25 µm +/- 0.25 µm | undoped |
| 3 | GaAs | | 0.01 µm | undoped |
| 2 | AlAs | | 0.1 µm | undoped |
| 1 | GaAs | | Substrate | |

Table 6: Epitaxial structure for a single mode waveguide.

FIGURE 31

| Layer | Material | Mole Fraction | Thickness | Doping |
|---|---|---|---|---|
| 5 | $Al_xGa_{1-x}As$ | x = 0.15 +/- 0.02 | 8 µm +/- 2 µm | undoped |
| 4 | $Al_xGa_{1-x}As$ | x = 0.4 +/- 0.02 | 4 µm +/- 0.5 µm | undoped |
| 3 | GaAs | | 0.01 µm | undoped |
| 2 | AlAs | | 0.1 µm | undoped |
| 1 | GaAs | | Substrate | |

Table 7: Epitaxial structure for a multi mode waveguide.

FIGURE 32

| Grating | Grating pitch (Å) |
|---|---|
| OSU-884-1 | 2412.8 |
| OSU-884-2 | 2429.3 |
| OSU-884-3 | 2450.4 |
| OSU-884-4 | 2469.3 |
| OSU-884-5 | 2487.9 |
| OSU-884-6 | 2409.1 |
| OSU-884-7 | 2432.2 |
| OSU-884-8 | 2452.9 |
| OSU-884-9 | 2473.6 |
| OSU-884-10 | 2493.2 |

Table 6: Series of grating pitches evaluated

| EDFA Pump Amplifier Specifications | | |
|---|---|---|
| Peak wavelength | 978 | nm |
| Pump bandwidth tolerence | +/-5 | nm |
| Power rating bandwidth | +/-10 | nm |
| Power requirement | 200 | mw |
| MTTF | >1E5 | hrs |
| Stability | | |
| Power | +/-1 | % |
| Spectral | +/-1 | % |
| Fiber requirement | | |
| Coupling fiber | 1060 | Flexcore |
| | 980 | CS |
| core dia. | 4-5 | μm |
| NA | 0.15 | |
| cutoff wavelength | 950-1000 | nm |
| mode | single @ 1550 | nm |
| center wavelength | 1550 | nm |
| splice | fusion | |
| Pump sytem module cost | 5K | $ |

Table 7. EDFA pump amplifier requirements [16].

FIGURE 37

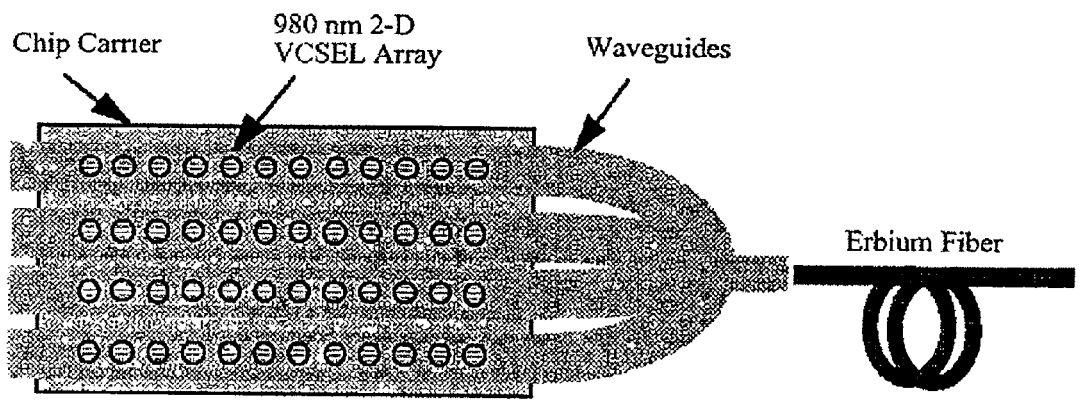

FIGURE 38

Fan-Out

Fan-In

Fan-Out/Fan-In

RESONANT CAVITY ENHANCED VCSEL/ WAVEGUIDE GRATING COUPLER

RELATED APPLICATION

This is a continuation of application Ser. No. 09/867,719 filed May 29, 2001, now abandoned.

The present application claims priority under 35 U.S.C. §119(e) from provisional application No. 60/207,525, filed May 26, 2000.

TECHNICAL FIELD

The present invention is directed generally to coupling light from one location to another, and more particularly to a resonant cavity enhanced waveguide grating coupler.

BACKGROUND ART

Coupling of light from one point to another or one location to another, particularly in optical transmission of information, production of high power coherent light, pump sources for laser, and the like. The challenges presented are illustrated, for example, in the context of developing high power vertical cavity surface emitting lasers (VCSELs).

High-power VCSEL arrays have been demonstrated by several research groups. Grabherr et al. reported VCSEL power densities exceeding 300 W/cm$^2$ from a 23-element array [M. Grabherr et. al., Electron. Lett., vol. 34, p.1227, 1998]. Francis et al. demonstrated VCSEL power in excess of 2-W continuous wave and 5 W pulsed from a 1000-element VCSEL array [D. Francis, et. al., IEEE Int. Semiconductor Laser Conf. (ISLC), Nara, Japan, October 1998]. Chen et al. also reported the power density of about 10 kW/cm$^2$ Steradian from an array of 1600 VCSELs using a microlens array to individually collimate light from each laser [H. Chen, et. al., IEEE Photon. Technol. Lett., vol. 11, No. 5, p. 506, May 1999]. However, their beam quality at high power is still poor. A high quality beam requires a narrow linewidth single mode with high spatial and temporal coherence.

In order to produce coherent, single-frequency, high-power arrays of VCSELs, the elements of one or two dimensional VCSEL arrays should be phase-locked. Although the light from each individual VCSEL is coherent, the phase and frequencies (or wavelengths) of the light from each VCSEL are slightly different and therefore uncorrelated. For such an incoherent array comprising N elements producing the same power P, the on-axis power in the far-field is ~NP. However, if the array as a whole can be made coherent, in phase, and with a single frequency, the on-axis power in the far-field is N$^2$P and the width of the radiation pattern is reduced by ~1/N. Previous efforts to phase-lock arrays of VCSELs have used diffraction coupling [J. R. Legar, et. al., Appl. Phys. Lett., vol. 52, p.1771, 1988], and evanescent coupling.[H. J. Yoo, et. al., Appl. Phys. Lett., vol. 56, p.1198, 1990]. Diffraction coupling depends on geometrical scattering of light and evanescent coupling requires that the optical field of adjacent array elements overlap. Both approaches impose restrictions on the array architecture. More importantly, these existing approaches have had very limited success, even in 1D edge-emitting arrays where both approaches have been extensively investigated. Recently, Choquette et al. has demonstrated phase locking in a VCSEL array using an antiguide approach [D. K. Serkland, et. al., IEEE LEOS Summer Topical Meeting, p.267, 1999].

SUMMARY OF THE INVENTION

The above problems and disadvantages of previous attempts to provide effective and efficient coupling of light are overcome by the present invention which includes a waveguide and surface normal gratings.

In accordance with the present invention, an optical coupler is provided comprising first and second mirrors, wherein the first mirror is positioned with respect to the second mirror so that a resonant cavity is defined between them, a waveguide structure positioned in the resonant cavity and including a surface-normal grating structure, and wherein a thickness of the resonant cavity is selected so that a phase matching condition is satisfied for resonance in the resonant cavity.

In one embodiment of the present invention, at least one of the first and second mirrors is formed from a structure in an optoelectronic device. Alternatively, at least one of the first and second mirrors is formed from a semiconductor layer.

In another embodiment, at least one of the first and second mirrors is formed as a semiconductor distributed bragg reflector. Alternatively, at least one of the first and second mirrors is formed as a dielectric distributed bragg reflector.

At least one of the first and second mirrors can be a mirror in a vertical cavity surface emitting laser (VCSEL) structure. Also, at least one of the first and second mirrors is a mirror in a photodetector structure, in a different embodiment.

The first and second mirrors and waveguide structure can be formed in a hybrid structure, or a monolithic structure.

The surface-normal grating structure is shaped so that first order modes of light It incident upon the surface-normal grating structure are coupled into the waveguide while zero-order modes are reflected out into the resonant cavity and reflected by the mirror.

Coupling into and out of a waveguide using a grating is a simple method to transfer free space data to waveguides in optoelectronic integrated circuits (OEICs). Waveguide gratings can perform a large variety of functions such as reflection, filtering, deflection, and input/output coupling. A periodically modulated grating can perform holographic-wavefront conversion. As a coupler, the grating converts a waveguide mode into a radiation mode, or vice versa. Surface-normal grating couplers direct light perpendicularly into and out of the waveguide. The combination of the waveguide and surface normal grating couplers permits arrays of VCSELs to be used to create an optical source with high right angle mode output power. Arrays of VCSELs can then be used as high-power light sources for use in a variety of military and commercial applications, such as free-space optical communications, on-chip/chip-to-chip communications, RF photonics, laser radar, and optical pump sources for solid-state and fiber lasers.

As will be appreciated upon consideration of the following detained description of the invention and accompanying drawings, there are many advantages and features of the present invention, which in turn lead to many new and useful applications of the invention.

BRIEF DESCRIPTION OF THE DRAWINGS

FIG. 1 is an illustration of a resonant cavity enhance (RCE) waveguide grating coupler in accordance with the present invention.

FIG. 2 is an illustration of a hybrid RCE VCSEL/ waveguide grating coupler in accordance with the present invention.

FIG. 3 is an illustration of a hybrid RCE photodetector/ waveguide grating coupler in accordance with the present invention.

FIG. 4 is a schematic of a monolithic RCE waveguide grating coupler in which a mirror M1 is monolithically integrated with a waveguide structure and a mirror M2 on a semiconductor substrate in accordance with the present invention.

FIG. 5 is a simplified monolithic RCE VCSEL/waveguide grating coupler which can be realized using an epitaxial regrowth technique in accordance with the present invention.

FIG. 6 is a simplified monolithic RCE photodetector/waveguide grating coupler which can be realized using an epitaxial regrowth technique in accordance with the present invention.

FIG. 7 is a simplified monolithic RCE VCSEL/waveguide grating coupler which can be realized using a wafer bonding technique in accordance with the present invention.

FIG. 8 is a simplified monolithic RCE photodetector/waveguide grating coupler which can be realized using a wafer bonding technique in accordance with the present invention.

FIGS. 13A and 13B are graphs of the calculated output power coupled into the waveguide as a function of diffraction efficiency in accordance with the present invention.

FIGS. 15A and 15B are graphs of the calculated waveguide output for a two VCSEL/waveguide grating system as a function of diffraction efficiency in accordance with the present invention.

FIG. 29 is a diagram of peak wavelengths of a 1×5 VCSEL array in accordance with the present invention.

FIG. 30 is a diagram of mean wavelengths of a 1×5 VCSEL array in accordance with the present invention.

FIG. 31 is a diagram of an epitaxial structure for a single mode waveguide in accordance with the present invention.

FIG. 32 is a diagram of an epitaxial structure for a multimode waveguide in accordance with the present invention.

FIG. 37 is a diagram of the EDFA pump amplifier characteristics in accordance with the present invention.

FIG. 38 is a diagram of a parallel array for an optical pump in accordance with the present invention.

DETAILED DESCRIPTION OF THE INVENTION

Figure 9:
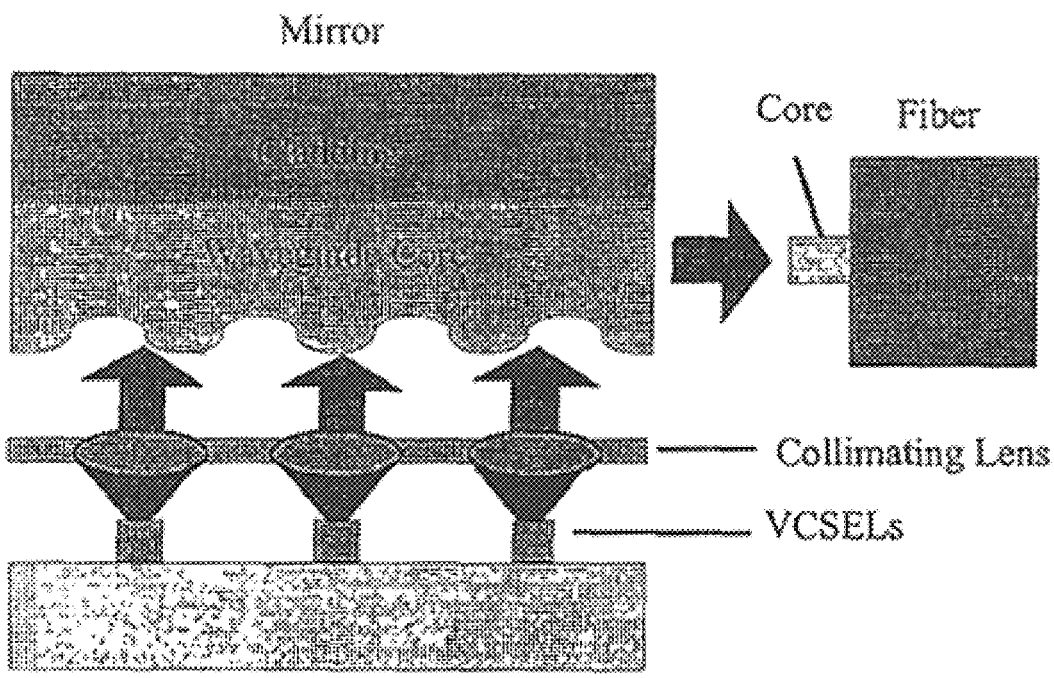
FIG. 9 is a simplified hybrid system with VCSELs coupled through a surface normal grating into a waveguide in accordance with the present invention.

A resonant cavity enhanced (RCE) waveguide grating coupler includes a surface-normal waveguide grating inserted into a Fabry-Perot cavity (FIG. 1). The Fabry-Perot cavity has two mirrors and, between them, a cavity which contains a waveguide grating layer. The mirror can be either a semiconductor layer, a semiconductor distributed bragg reflector (DBR) or a dielectric DBR. Semiconductor DBR mirrors can be a part of an optoelectronic device, particularly a vertical cavity surface emitting laser (VCSEL) or a photodetector. The thickness of the cavity should be designed in such a way that a phase matching condition is satisfied for resonance. Light can be coupled into/out of an optical fiber through the surface-normal waveguide grating. A coupling efficiency into the waveguide layer can be greatly enhanced due to the large increase of the resonant optical field introduced by the Fabry-Perot cavity. Two approaches can be used to realize the RCE waveguide grating coupler: hybrid and monolithic.

FIG. 2 shows an example of a simplified hybrid RCE VCSEL/waveguide grating coupler which comprises a VCSEL and a waveguide structure which contains a waveguide layer with a surface-normal grating in combination with a mirror M2. The VCSEL serves as a mirror M1 as well as a light source. Collimating optics can be used to capture light from the VCSEL more efficiently and direct it into the waveguide.

The output of the VCSEL is coupled through a grating into a waveguide for edge emission from the waveguide structure. By incorporating a highly reflective mirror M2 into a VCSEL/waveguide grating system, waveguide coupling can be greatly enhanced by multiple reflections between the mirror M2 and the mirror M1. The multiple reflections cause the light to be continually directed back into the waveguide. The waveguide grating coupler then redirects this vertical light horizontally into the waveguide. Hence, by superposition, the waveguide coupled output power can be considerably increased.

FIG. 3 shows a simplified hybrid RCE photodetector/waveguide grating coupler which comprises a photodetector and a waveguide structure which contains a waveguide layer with a surface-normal grating in combination with a mirror M2. The photodetector can be served as a mirror M1. The photodetector can be either a non-resonant photodetector or an RCE photodetector.

Light from the waveguide is outcoupled through the surface-normal grating and then illuminated onto the photodetector. The waveguide grating coupler functions as a beam router which directs the horizontal light into the vertical light.

FIG. 4 shows a schematic of a monolithic RCE waveguide grating coupler in which a mirror M1 is monolithically integrated with a waveguide structure and a mirror M2 on a semiconductor substrate. The waveguide structure can be a part of M1 and inserted into any positions in M1. A monolithic RCE waveguide grating coupler has several advantages over the hybrid counterpart, including no need for external optics, easy alignment, and a simple package. This monolithic structure can be implemented using two technical approaches: epitaxial regrowth technique and wafer bonding technique.

FIG. 5 shows a simplified monolithic RCE VCSEL/waveguide grating coupler which can be realized using an epitaxial regrowth technique. The surface-normal grating is first fabricated into the waveguide layer using an etching technique. Then, an epitaxial regrowth is performed to grow the VCSEL structure using an epitaxial growth machine.

FIG. 6 shows a simplified monolithic RCE photodetector/waveguide grating coupler which can be realized using an epitaxial regrowth technique. The surface-normal grating is first fabricated into the waveguide layer using an etching technique. Then, an epitaxial regrowth is performed to grow the photodetector structure.

FIG. 7 shows a simplified monolithic RCE VCSEL/waveguide grating coupler which can be realized using a wafer bonding technique. Two epitaxial wafers are separately grown on semiconductor substrates using an epitaxial growth machine, a wafer A and a wafer B. The wafer A contains a waveguide structure and M2 while the wafer B contains a VCSEL (M1). The surface-normal grating is first fabricated on the wafer A using an etching technique. Then, wafer bonding is performed to fuse the wafers A and B. The wafer-fused monolithic RCE VCSEL/waveguide grating coupler has air/semiconductor gratings. These gratings are embedded between the wafers A and B. The efficiency of the grating can be enhanced by enclosing air in its grooves during the fabrication process. The air/semiconductor gratings have a large coupling efficiency due to the large difference between the refractive index of air and that of a semiconductor.

FIG. 8 shows a simplified monolithic RCE photodetector/waveguide grating coupler which can be realized using a wafer bonding technique. Two epitaxial wafers are separately grown on semiconductor substrates using an epitaxial growth machine, a wafer C and a wafer D. The wafer C contains a waveguide structure and M2 while the wafer D contains a photodetector (M1). The surface-normal grating is first fabricated on the wafer C using an etching technique. Then, wafer bonding is performed to fuse the wafers C and D. The wafer-fused monolithic RCE photodetector/waveguide grating coupler has air/semiconductor gratings. These gratings are embedded between the wafers C and D. The efficiency of the grating can be enhanced by enclosing air in its grooves during the fabrication process.

The monolithic RCE VCSEL/WGC structure offers a method to monolithically integrate active VCSELs and passive waveguide devices. This structure has the inherently bi-directional nature which enables simultaneous coupling into two opposite directions in the waveguide. In addition, by incorporating the photodetectors into the VCSEL/waveguide grating structure, the bi-directional coupling capability can further increase the flexibility in the design of complex optical devices and circuits, allowing entirely new hardware architectures to be implemented. These bi-directional devices can be utilized in applications such as optical communications, optical signal processing, and optical networks. Some of the specific applications are optical transceivers; distributed crossbar switches; coherent high power sources; multiplexers and demultiplexers Resonant Cavity Enhanced VCSEL/Waveguide Grating Coupler In accordance with one embodiment of the present invention, a hybrid VCSEL/waveguide architecture is provided by which, for example, coherent high-power light sources can be achieved. The hybrid VCSEL/waveguide structure comprises a VCSEL array and a single waveguide with a periodic grating in combination with a substrate reflector (FIG. 9). The waveguide is attached to the VCSEL array through mechanical spacers. Optical coupling between the array elements is provided by the grating coupled waveguide. An optical waveguide with a series of gratings allows the distribution and coupling of light into and out of individual VCSEL elements, thereby locking each element into a coherent, single frequency array mode.

By incorporating a highly reflective substrate reflector into a VCSEL/waveguide grating system, waveguide coupling can be greatly enhanced by multiple reflections between the substrate reflector and the top VCSEL mirror. The multiple reflections cause the light to be continually directed back into the waveguide. The waveguide grating coupler then redirects this vertical light horizontally into the waveguide. Hence, by superposition, the waveguide coupled output power can be considerably increased. Unlike previous phase locking approaches, the distribution waveguide method can provide phase locking by controlling a precise amount of coupling between array elements independent of the element size and element spacing. The grating coupled waveguide provides a linear array of elements which can be extended into a 2D array with the integration of a waveguide coupler.

Theoretical Background

The waveguide grating coupler is a key component of the VCSEL/waveguide grating system. The performance of the system depends largely on the grating coupler. It is of considerable interest to develop predictions of the efficiency of the diffraction process in terms of the waveguide and grating parameters. The coupling efficiency of a grating coupler is dependent on several parameters such as the grating depth, the index modulation of the grating, and the type of grating.

Several theoretical models have been developed to calculate the waveguide-grating interactions in FIG. 9: Simplified hybrid system with VCSELs coupled through a surface normal grating into a waveguide. Waveguide Core VCSELs Collimating Lens Cladding Mirror Fiber Core 3 Patent terms of the tooth profile, composition, and position of the grating with respect to the optical waveguide. One model uses a modal formulation based on a Floquet-Bloch approach [Hadjicostas, et al., IEEE JQE, Vol. 26, No. 5, p.893, May 1990]. Another model relies on a boundary element method [Evans, et. al., IEEE JQE, Vol. 27, No. 6, p.1594, June 1991] and allows analysis of arbitrary grating profiles. The predictions of the Floquet-Bloch model have been compared to a complete, self-consistent experimental measurement of the wavelength dependence of reflection, transmission, and outcoupling from a Bragg second-order grating. Comparisons were made with the calculations for 50% duty cycle square-wave gratings with tooth depths equal to the experimentally measured values ranging from 40 nm to 600 nm. Close agreement between the theoretical and experimental results were obtained [Ayekavadi, et. al., SPIE meeting, Los Angeles, January 1991].

Several potential waveguide structures were evaluated in terms of the compositions and thicknesses of the waveguide layers using models mentioned above. A detailed design process can be found in provisional patent application, serial No. 60/207,590, filed May 26, 2000, entitled "High-Power Coherent Arrays of Vertical Cavity Surface Emitting Lasers", and non-provisional patent application, filed on even date herewith, entitled "High-Power Coherent Arrays of Vertical Cavity Surface Emitting Lasers", inventors Peter Guilfoyle, Gary S. Evans, and Cheng C. Ko, and assigned to the same assignee as the present application, the subject matter of both is incorporated herein by reference. The waveguide structures were based on GaAs and AlGaAs semiconductor materials. They were designed for single mode and multimode operations at 850 nm. A simple model was developed to describe the coupling process in a VCSEL/waveguide grating system. This model does not require rigorous mathematical descriptions and thus gives better understanding of the coupling process. The coupling characteristics were studied as a function of the diffraction efficiency and the reflectivities of the VCSEL and the waveguide substrate.

Waveguide and Grating Design

Figure 10:
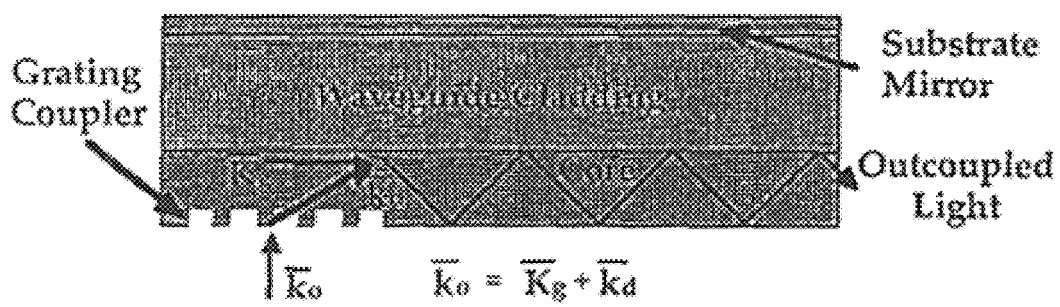
FIG. 10 is a schematic drawing of a waveguide structure where the VCSEL light is coupled through the surface-normal second-order grating coupler and showing the phase-matching condition in accordance with the present invention.

FIG. 10 shows a schematic drawing of a waveguide structure where the VCSEL light is coupled through the surface-normal second-order grating coupler. The phase matching condition dictates that the difference between the wavevector of the incident beam and the wavevector of the diffracted beam has to be conserved through the wavevector of the surface grating. As a result of the phase matching condition, the grating period, $\Lambda$, for the surface normal grating coupler is chosen to be $\Lambda = \lambda_o / \eta_{eff}$, where $\lambda_o$ is the wavelength of the incident light and $\eta_{eff}$ is the effective index of the guided mode [Gary A. Evans and J. M. Hammer, "Surface Emitting Semiconductor Lasers and Arrays", Academic Press, 1993.]

Figure 11:
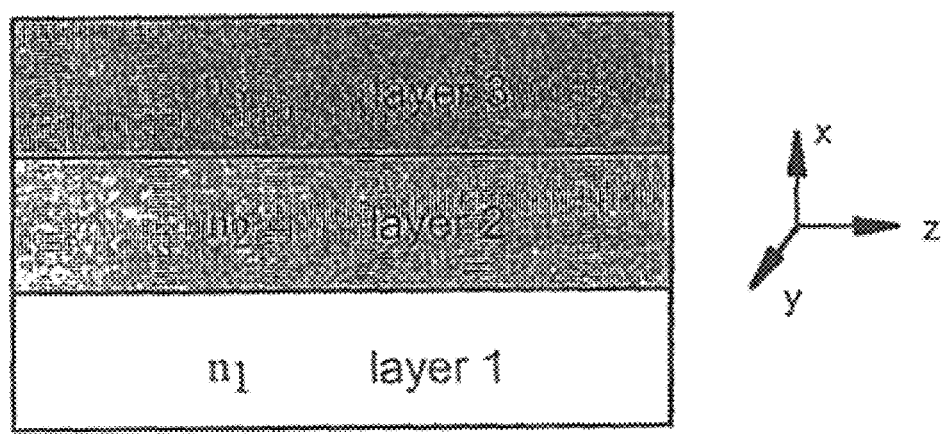
FIG. 11 is a schematic diagram of a three-layer waveguide structure in accordance with the present invention.

A typical three-layer waveguide is shown in FIG. 11. Layer 2 is the waveguide core and layers 1 and 3 are the cladding layers. $n_i$ is the refractive index of layer i. Two different waveguide structures were initially examined; asymmetric and symmetric. An asymmetric waveguide has different refractive indices in the cladding layers ($n_1 \neq n_3$), while the refractive indices in the cladding layers are the same in a symmetric waveguide ($n_1 = n_3$). However, an asymmetric waveguide structure was chosen for this program. It was found from the design process that a symmetric waveguide has several disadvantages over an asymmetric waveguide structure. These include the requirement of an extra epitaxial layer growth and a low optical coupling efficiency due to low index difference at the grating interface. The waveguide were designed for both singlemode and multimode operations. The number of modes in the waveguide is dependent on the thickness of the waveguide core layer as well as the index difference between the waveguide and cladding layers. A detailed description of the waveguide and grating structures can be found in the above-referenced provisional and non-provisional patent applications.

Coupling of a VCSEL/Waveguide Grating System

In order to analyze the coupling behavior in a VCSEL/waveguide grating system, a relatively simple model is also developed. This model does not require rigorous mathematical descriptions and thus gives better understanding of the coupling process. Such a model can help in elucidating the basic mechanisms of the coupling process and allows the calculation of the waveguide-coupled output power in this structure. The coupling characteristics are studied as a function of the diffraction efficiency and the reflectivities of the VCSEL and the waveguide substrate. For simplicity, we initially calculate the coupling of a single cell of the VCSEL/waveguide grating system. They are then used to expand the calculation to a two element VCSEL/waveguide grating system. The calculations performed for a single and a two element VCSEL/waveguide grating system can be easily expanded to an N VCSEL/waveguide grating system.

Single VCSEL/Waveguide Grating System

Figure 12:
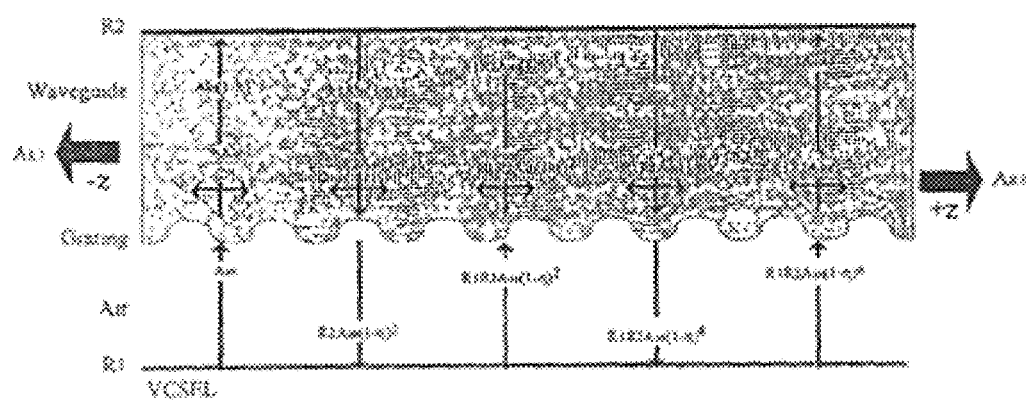
FIG. 12 is a diagram illustrating a mathematical model showing the coupling of a single VCSEL output into a waveguide through the surface normal grating in accordance with the present invention.

FIG. 12 is a mathematical model showing the coupling of a single VCSEL output into a waveguide through the surface normal grating. Collimated light from the VCSEL is emitted in transverse electromagnetic mode $TEM_{00}$ ($A_{in}$). This is depicted by the arrows in FIG. 12. The surface normal grating is designed to separate first-order modes and couple these modes into the waveguide. The zero-order mode (undiffracted light) is reflected back by the reflection from the mirror on the waveguide. Through a reflections of $R_1$ and $R_2$ the zero-order mode sustains the amplitude of the first-order modes. This is achieved through superposition.

The waveguide-coupled output power is calculated by summing all the contributions resulting from the multiple reflections at the interfaces $R_1$ and $R_2$ as shown in FIG. 12. The output power coupled into the +z direction $A_{R1}$ is given by:

$$A_{R1} = \frac{\eta}{2} + \frac{\eta}{2} R_2(1-\eta) + \frac{\eta}{2} R_1 R_2 (1-\eta)^2 + \frac{\eta}{2} R_1 R_2^2 (1-\eta)^3 + \quad (1)$$

$$\frac{\eta}{2} R_1^2 R_2^2 (1-\eta)^4 + \ldots$$

$$= \frac{\eta}{2}[1 + R_1 R_2 (1-\eta)^2 + R_1^2 R_2^2 (1-\eta)^4 + R_1^3 R_2^3 (1-\eta)^6 +$$

$$\ldots] + \frac{\eta}{2}[R_2(1-\eta) + R_1 R_2^2 (1-\eta)^3 + R_1^2 R_2^3 (1-\eta)^5 + \ldots]$$

$$= \frac{\eta}{2}\left[\frac{1}{1 - R_1 R_2 (1-\eta)^2} + \frac{R_2(1-\eta)}{1 - R_1 R_2 (1-\eta)^2}\right]$$

$$= \frac{\eta}{2} \frac{1 + R_2(1-\eta)}{1 - R_1 R_2 (1-\eta)^2}.$$

where $R_1$ and $R_2$ are the reflectivities of the VCSEL and the substrate reflector; $A_{R1}$ is normalized to the incident beam $A_{in}$; is the diffraction efficiency of the surface-normal grating coupler. To simplify the equation, infinite numerical series are approximated using the following relation;

$$\sum_{k=0}^{\infty} aq^k = \frac{a}{1-q} \quad |q| < 1 \quad (2)$$

Equation (1) is derived by assuming that the diffraction efficiency from the waveguide is the same as that from the VCSEL and there is no reflection at the grating coupler. It is also assumed that the zero-order mode reflected from the substrate mirror is in phase with the component diffracted into the waveguide. The phase matching condition is determined by the thickness of the cladding layers below the waveguide. In addition, the absorption and scattering losses in the waveguide are assumed to be minimal.

The output power coupled into the −z direction $A_{1L}$ can be calculated in a similar way to $A_{R1}$. However, it is easily seen that $A_{L1} = A_{R1}$, since, in this calculation, a symmetric grating is assumed. When the grating is symmetric, the coupling processes are also symmetric. Therefore, light from the VCSEL is coupled by the surface normal grating coupler and is split into two different directions at the same time with the same magnitude.

FIGS. 13(A) and 13(B) shows the calculated output power coupled into the waveguide as a function of the diffraction efficiency for different values of $R_1$. For an $R_2$ of 0.35, which is shown in FIG. 13(A), the normalized output power approximately exhibits a linear dependence on the diffraction efficiency for all values of $R_1$. A reflectivity of $R_2 = 0.35$ is typical of a GaAs-air interface. In order to increase the guided output, a large $\eta$ is required, which is difficult to realize due to the problems of waveguide materials and grating fabrication technology. The coupling characteristics can be substantially changed if a substrate mirror is used. The coupled output power can be increased by incorporating a highly reflective mirror into the backside of the waveguide structure. This can be accomplished using a simple gold mirror or a semiconductor (dielectric) mirror such as an epitaxially grown distributed bragg reflector (DBR).

FIG. 13(B) shows the calculated output power for a large $R_2$ of 0.95. Unlike the previous example in FIG. 13(A), the coupled output exhibits a nonlinear dependence on $\eta$ in which the output becomes saturated rapidly with $\eta$. For example, for $\eta$ of 0.1, the normalized output power is >0.4 for $R_1 = 0.99$. This is four times larger than that of $R_2 = 0.35$. Therefore, the waveguide grating structure with a highly reflective mirror allows the use of low diffraction efficiency for large coupling efficiency of the VCSEL into the waveguide. As can be seen in FIG. 5, the effect of the substrate reflector on the coupled output power becomes smaller as $\eta$ increases. This is because for high $\eta$, a large amount of VCSEL light is diffracted into the waveguide before it reaches the substrate mirror. For $\eta$ of 1, the coupled output approaches 0.5 normalized power, which is the theoretical maximum. In this case, all the light from the VCSEL is converted into the first-order modes in the waveguide in a single pass.

Two Element VCSEL/Waveguide Grating System

Figure 14:
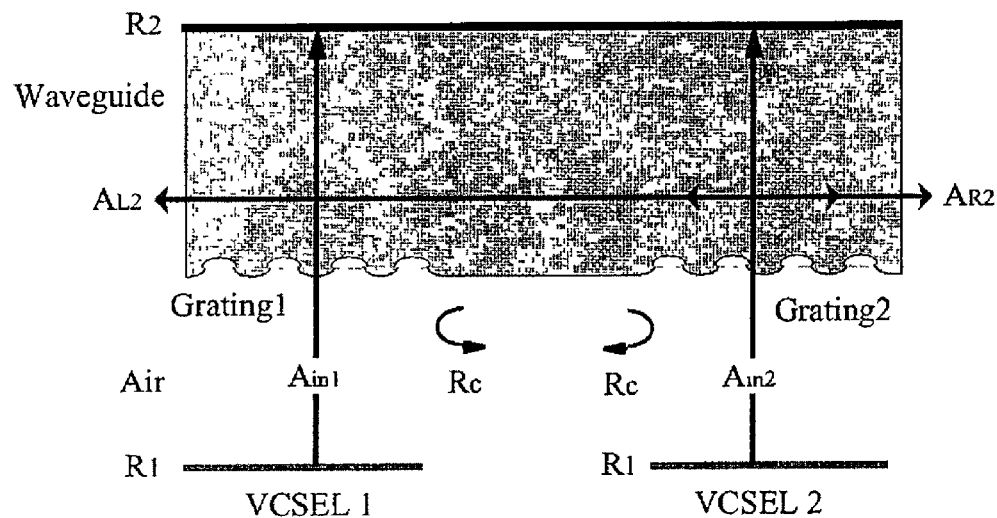
FIG. 14 is a schematic diagram of a two VCSEL/waveguide system in accordance with the present invention.

A two element VCSEL/waveguide grating structure is shown in FIG. 14. Light from each source (VCSEL 1 and VCSEL 2) is coupled by the grating coupler and diffracted equally to the left and to the right of each grating (Grating 1 and Grating 2). The waveguide allows the light to travel in either direction. The first-order diffracted light can be transmitted through the grating and reflected back from the grating. The light can be also coupled back into the VCSELs. It is estimated that only a small amount of optical power is required to achieve phase-locking in the longitudinal direction (z). The light inputs to the gratings from the VCSELs are defined by $A_{in1}$ and $A_{in2}$. The light output on the right (left) side of the waveguide is designated as $A_{R2}$ ($A_{L2}$). It includes the following optical contributions: light from VCSEL 2 through Grating 2, light from VCSEL 1 through Gratings 1 and 2; and light from VCSELs 1 and 2 which experiences multiple reflections due to the in-plane reflections of the gratings. The in-plane reflectivity from the waveguide grating is designated as $R_c$.

The waveguide-coupled output power is calculated by summing all the contributions described above and is given by:

$$A_{R2} = M_2 M_1 A_{in1} + (1 + M_2 S) A_{in2} \quad (3)$$

$$A_{L2} = (1 + M_2 S) A_{in1} + M_2 M_1 A_{in2} \quad (4)$$

where $$M_1 = \frac{n}{2} \frac{1 + R_2(1-\eta)}{1 - R_1 R_2 (1-\eta)^2} \quad (5)$$

$$M_2 = \frac{K}{1 - S^2} \quad (6)$$

$$K = (1 - R_c)[(1-n) + M_1 R_1 \eta] \quad (7)$$

$$S = R_c + (1 - R_c) M_1 R_1 \eta \quad (8)$$

$M_1$ is the output power for a single VCSEL/waveguide structure and $M_2$ is a coupling coefficient due to multiple reflections between Gratings 1 and 2. K and S are the transmission and reflection coefficients of the grating, respectively. It is assumed in this calculation that all the gratings are symmetric and their properties are the same.

In FIG. 15, the output for $A_{2R}$ has been calculated for various $R_1$ values for two different $R_2$ of 0.35 (a) and 0.95 (b). The light output is plotted versus the diffraction efficiency of the waveguide grating. In this calculation, it is assumed that $A_{in1}$ is equal to $A_{in2}$. The values have been normalized to $A_{in1}$. The in-plane grating reflectivity, $R_c$ is assumed to be zero. As shown in FIG. 15, the output power shows a trend similar to the case of a single VCSEL/ waveguide structure. Waveguide coupling can be considerably enhanced by using a highly reflective mirror on the backside of the waveguide. As η increases, the output is increased rapidly, and is saturated with a small value of η for $R_2=0.95$. The output power becomes approximately twice larger in magnitude than that of the single cell. This is because of an increase in the number of VCSELs. The coupling efficiency is also increased with an increase in VCSEL reflectivity. It is expected that when $R_1$ increases, the amount of reflected light from the VCSELs will be enhanced, giving rise to the increase in the coupled power. The output power coupled into the $-z$ direction, $A_{L2}$ can be calculated using Equation (4). However, it is easily seen that $A_{L2}=A_{R2}$, since $A_{in1}=A_{in2}$ is assumed.

N VCSEL/Waveguide Grating System

The calculations performed for a single and a two VCSEL/waveguide grating systems can be expanded to an N VCSEL/waveguide grating system. FIG. 8 shows an N VCSEL/waveguide grating structure. The light inputs to the gratings from the VCSELs are defined by $A_{in1}$, $A_{in2}$, and $A_{inN}$. The light output on the right (left) side of the waveguide Is designated as $A_{RN}$ ($A_{LN}$).

Figure 16:
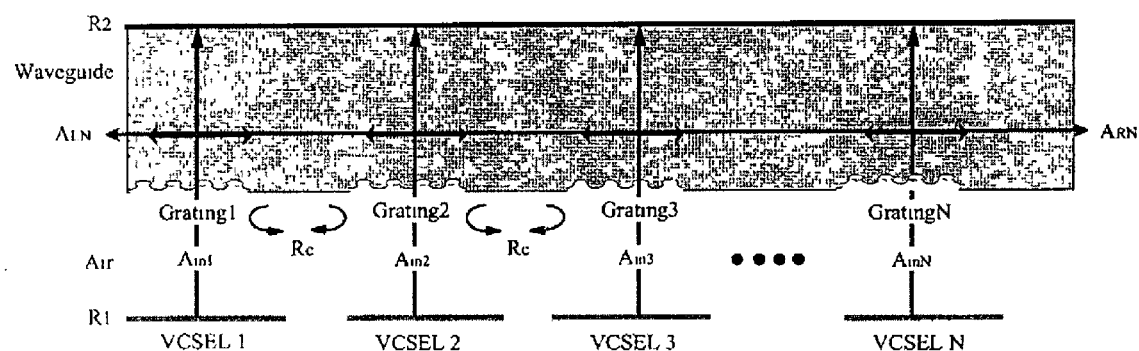
FIG. 16 is a schematic diagram of an N VCSEL/waveguide grating structure in accordance with the present invention.

The light outputs from the VCSELs will travel bidirectionally in the waveguide. In one direction, for example $+z$ direction, the light may encounter from 1 to N gratings before reaching the right end of the waveguide. The light in the other direction $(-z)$ may also experience more than one grating. In the structure shown in FIG. 16, each VCSEL makes different contributions to the output power depending on the position of the VCSEL. For example, the VCSEL N makes the most contribution to $A_{RN}$, while VCSEL 1 makes the least contribution to $A_{RN}$. This is because light output from VCSEL 1 should travel through N gratings to reach the right end of the waveguide, while light from VCSEL N encounters only one grating. When a light beam goes through a grating, the transmitted light output is decreased due to in-plane reflections at the grating as well as radiation losses into the VCSEL and the substrate mirror. If there is no in-plane reflection from the grating and the reflectivities of the VCSEL and substrate mirror are unity, then there will be no loss in the waveguide grating system. Hence, the light outputs from all the VCSELs will be diffracted into the waveguide and travel in the waveguide without loss.

The output power coupled into the waveguide in $+z$ direction, $A_{RN}$ can be given by:

$$A_{RN} = \prod_{i=1}^{N} M_1 A_{in1} + \prod_{i=3}^{N} M_1(1+M_2b_1)M_1 A_{in2} + \\ \prod_{i=4}^{N} M_1(1+M_3b_2)M_1 A_{in3} + \prod_{i=5}^{N} M_1(1+M_4b_3)M_1 A_{in4} + \\ \dots + \prod_{i=N}^{N} M_1(1+M_{N-1}b_{N-2})M_1 A_{inN-1} + \\ (1+M_N b_{N-1})M_1 A_{inN} \tag{9}$$

$$A_{LN} = (1+M_N b_{N-1})M_1 A_{in1} + \prod_{i=N}^{N} M_1(1+M_{N-1}b_{N-2})M_1 A_{in2} + \\ \dots + \prod_{i=4}^{N} M_1(1+M_3 b_2)M_1 A_{inN-2} + \\ \prod_{i=3}^{N} M_1(1+M_2 b_1)M_1 A_{inN-1} + \prod_{i=1}^{N} M_1 A_{inN} \tag{10}$$

where $$M_1 = \frac{K}{1-b_{i-1}S} \text{ for } i \geq 2 \tag{11}$$

$$b_1 = S \tag{12}$$

$$b_i = b_1 + KM_i b_{i-1} \text{ for } i \geq 1 \tag{13}$$

Here, $b_i$ is the reflection coefficient of the waveguide with i gratings. $M_i$ is the coupling coefficient due to multiple reflections In an i waveguide grating system. K and S, which are given in equations 7 and 8, are the transmission and reflection coefficients of a single grating, respectively.

Figure 17:
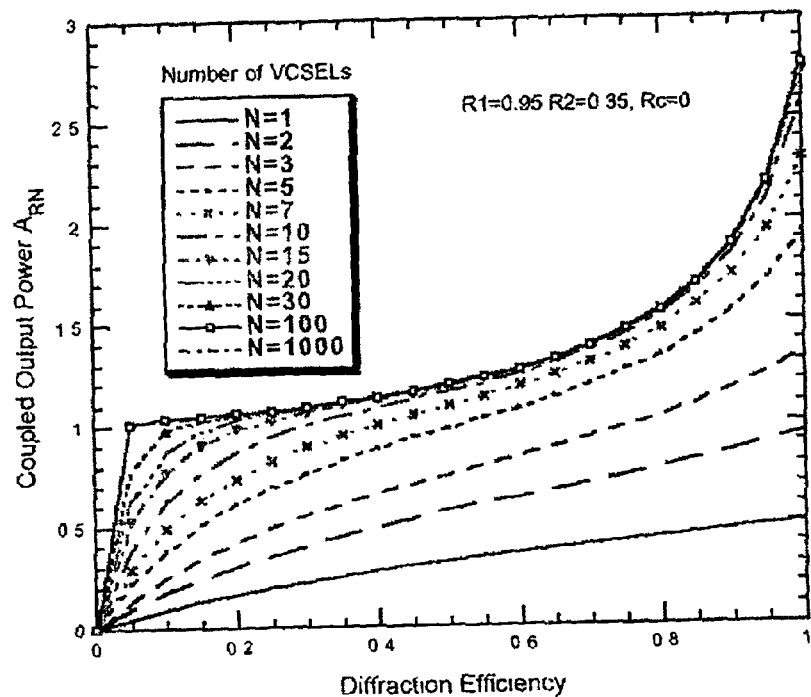
FIG. 17 is a graph of the calculated waveguide output for an N VCSEL/waveguide grating system as a function of diffraction efficiency for different number of VCSELs in accordance with the present invention.

The calculation was performed using a Mathcad program to obtain the coupled output power for various parameters. In FIG. 17, the waveguide coupled output power is plotted as a function of diffraction efficiency of the grating coupler. The simulations were performed for the number of VCSELs from 1 to 1000 for $R_1=0.95$, $R_2=0.35$, and $R_c=0$. It was assumed that all the VCSEL outputs are the same; $A_{in1}=A_{in2}=\ldots=A_{inN}$. As shown in the graph, the coupled output power is increased with the number of VCSELs as well as with the diffraction efficiency. A larger number of VCSELs produce more diffracted light coupled into the waveguide and hence increase the out-put power. However, as seen in the figure, the coupled output is saturated to a small value with a small number of VCSELs. For example, the output is saturated with only 10 VCSELs for η of $>\sim 0.5$. Increasing the number of VCSELs beyond 10 will not cause the output power to be further increased. As the number of VCSELs or gratings is increased, the more loss is introduced into the system. Since the reflectivities of the VCSELs and the substrate mirror are not unity, there are always radiation losses into the air via the waveguide substrate and the VCSEL.

When the number of VCSELs increases, the waveguide coupled light from those VCSELs will be increased. In order for the light generated from those VCSELs to contribute to the output, the coupled light should be larger than the loss that is introduced into the system by those VCSELs. As previously mentioned, the optical contributions of the VCSELs to $A_{RN}$ is position dependent. Therefore, the light will experience more loss as it travels through more gratings in the waveguide. For this case of $R_2=0.35$, most of the light is lost through the waveguide substrate into the air.

Figure 18:
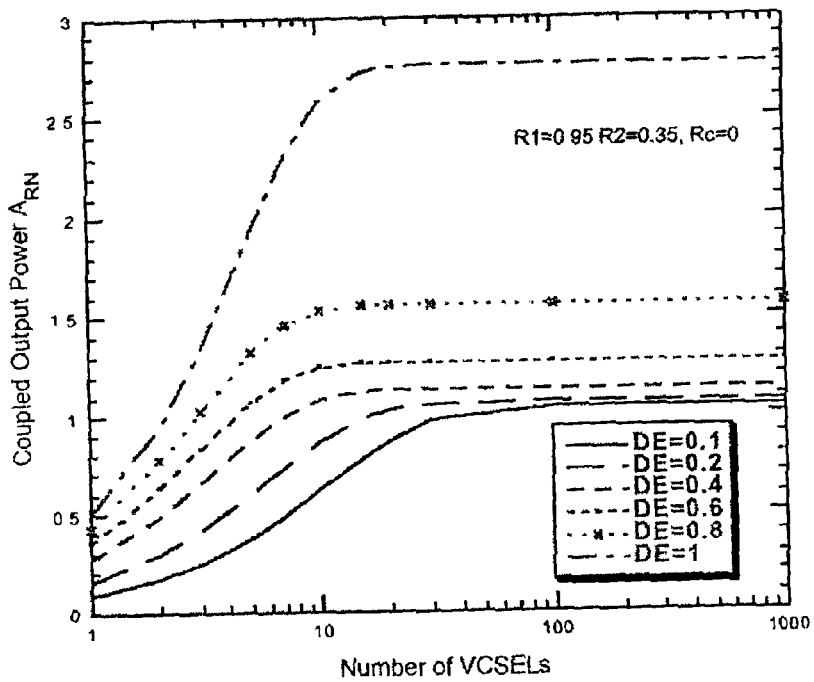
FIG. 18 is a graph of the coupled output power for an N VCSEL/waveguide grating system as a function of diffraction efficiencies in accordance with the present invention.

In FIG. 18, the coupled output power $A_{RN}$ is replotted as a function of the number of VCSELs for different diffraction efficiencies of 0.1, 0.2, 0.4, 0.6, 0.8, and 1. The figure shows clearly the effect of the number of VCSELs on the output power. The output is rapidly saturated for a small number of VCSELs. $A_{RN}$ has a maximum value of ~2.8 for η1. As η decreases, the number of VCSELs limiting the output becomes larger. For example, the number of VCSELs is increased from ~10 for η=1 to ~30 for η=0.1.

Figure 19:
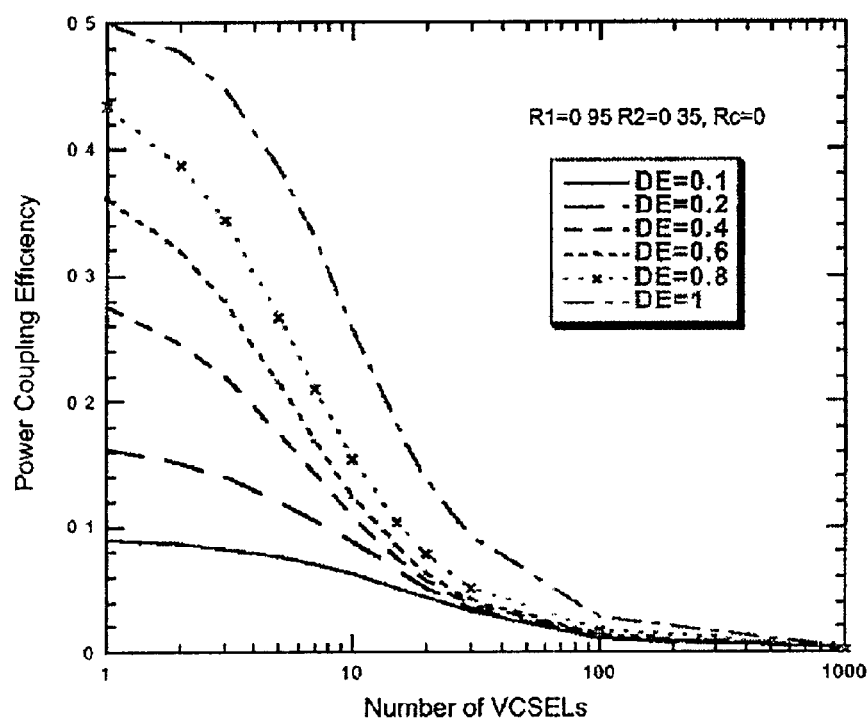
FIG. 19 is a graph of the power coupling efficiency for an N VCSEL/waveguide grating system as a function of the number of VCSELs for different diffraction efficiencies in accordance with the present invention.

FIG. 19 shows the power coupling efficiency plotted as a function of the number of VCSELs for $R_1=0.95$, $R_2=0.35$, and $R_c=0$. The power coupling efficiency of a VCSEL/ waveguide grating system is defined as the waveguide coupled output power divided by the number of VCSELs. This can be used as a figure-of-merit to determine an optimum number of VCSELs in an array in order to produce a coherent high power laser output. As can be seen in the graph, the coupling efficiency is strongly dependent on the diffraction efficiency of the grating. As the diffraction efficiency increases, the coupling efficiency increases. The maximum of the coupling efficiency becomes 0.5 for a single VCSEL/waveguide system with η=1. This is because the half of the first-order diffracted light is equally split into two directions. In addition, an increase in the number of VCSELs causes the power coupling efficiency to be reduced. This is mainly due to the radiation loss into the air resulting from the low reflectivity of the substrate mirror of 0.35. From this calculation, it is expected that to produce the output power of 0.87 mW, 10 VCSELs are required for the case of η=0 2.

Figure 20:
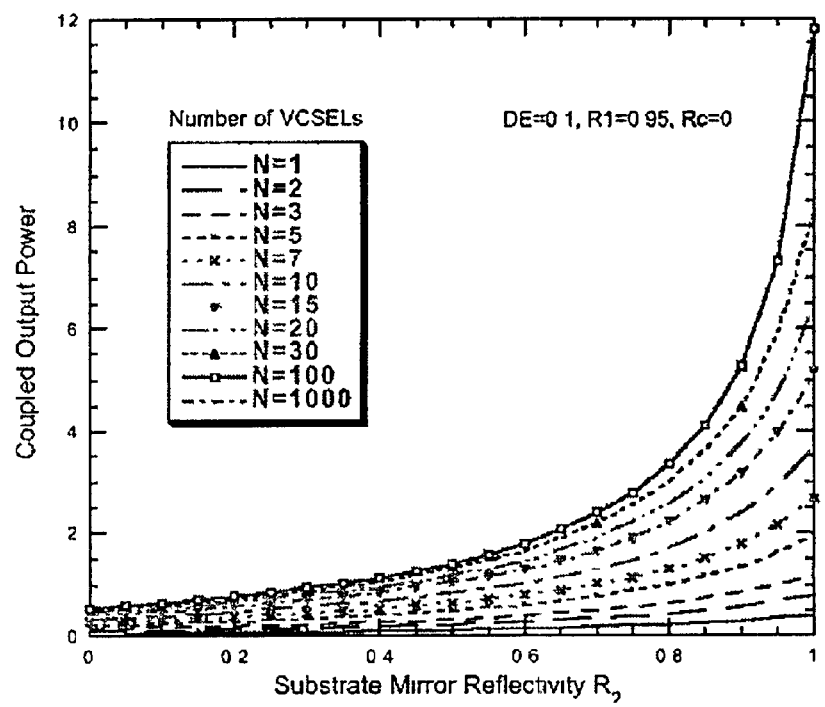
FIG. 20 is a graph of the coupled output power for an N VCSEL/waveguide grating system as a function of the substrate mirror reflectivity for a different number of VCSELs in accordance with the present invention.

As discussed previously, waveguide coupling can be considerably enhanced by incorporating a highly reflective mirror into the waveguide structure. The substrate mirror redirects light emitted toward the substrate, thereby increasing the coupling into the waveguide. FIG. 20 shows the coupled output power as a function of the substrate mirror reflectivity $R_2$. In this calculation, it is assumed that η=0.1, $R_1$=0.95, and $R_c$=0. From this figure, it is clearly seen that there is a strong dependence of the coupling efficiency into the waveguide on the substrate mirror reflectivity. The coupled output power is increased with the substrate mirror reflectivity. For the case of 100 VCSELs, it increases from ~1 for $R_2$=0.35 up to ~7.5 for $R_2$=0.95.

Figure 21:
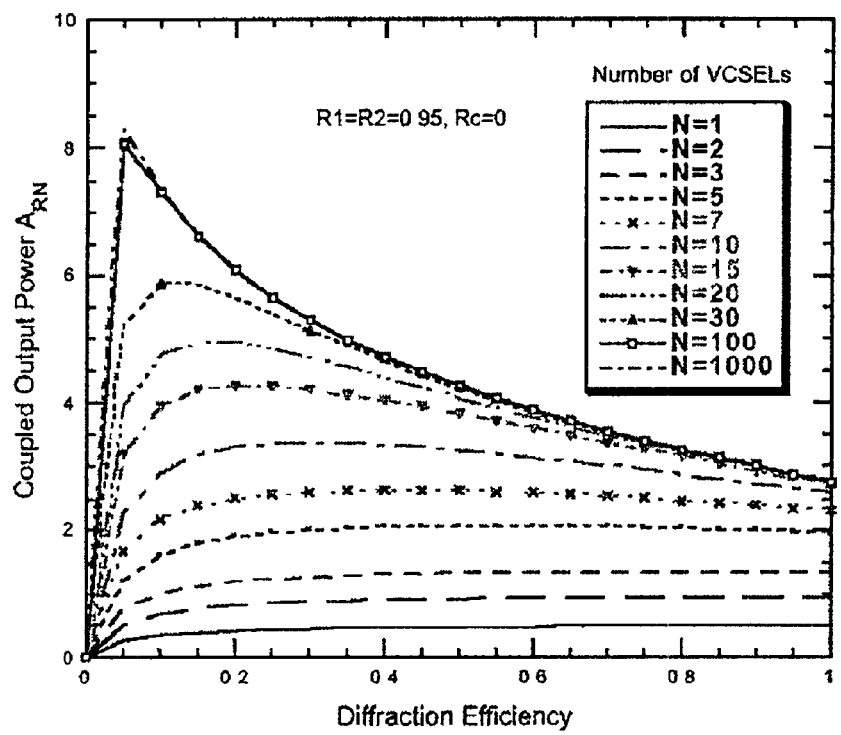
FIG. 21 is a graph of the calculated waveguide output for an N VCSEL/waveguide grating system as a function of diffraction efficiency for different number of VCSELs in accordance with the present invention.

FIG. 21 shows the output power coupled into the waveguide versus the diffraction efficiency of the grating for different number of VCSELs. The calculation is performed for $R_1$=0.95, $R_2$=0.95, and $R_c$=0. The number of VCSELs is varied from 1 to 1000. The output power is increased with the number of VCSELs. However, for a large value of η, the coupled output is rapidly saturated to a small value with a small number of VCSELs. This is similar to the case of $R_1$=0.95, $R_2$=0.35, and $R_c$=0, which is shown in FIG. 17. This is mainly because the effect of the substrate mirror on the coupling efficiency becomes smaller as η increases. For a large η, a large amount of VCSEL light is coupled into the waveguide before it reaches the substrate mirror. For a small η, the output power is considerably increased with the number of VCSELs. This is compared to the case for $R_2$=0.35 (see FIG. 17).

Figure 22:
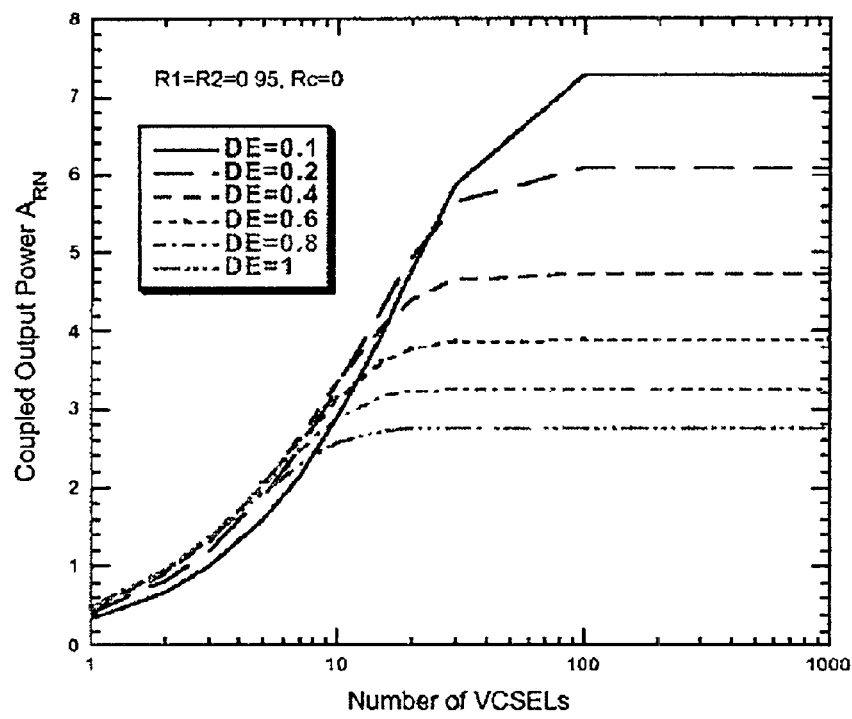
FIG. 22 is a graph of the coupled output power for an N VCSEL/waveguide grating system as a function of different diffraction efficiencies in accordance with the present invention.

In FIG. 22, the coupled output power is replotted versus the number of VCSELs for different diffraction efficiencies. The number of VCSELs has a pronounced effect on the coupling efficiency. The output is saturated with increasing the number of VCSELs. For a small η, the output is slowly saturated for a large number of VCSELs. However, as η increases, the number of VCSELs limiting the output becomes smaller. Unlike the previous example in FIG. 18, the coupled output exhibits a monotonous decrease with η for a large number of VCSELs. The output power approaches 18 7.5 for η=0.1 with ~100 VCSELs, while it reaches only ~2.8 for η=1 with ~15 VCSELs.

Figure 23:
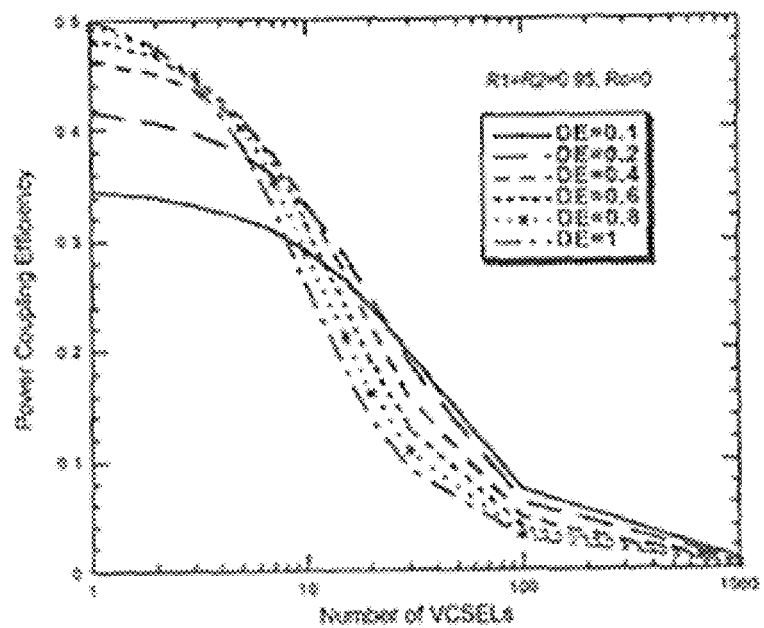
FIG. 23 is a graph of the power coupling efficiency for an N VCSEL/waveguide grating system as a function of the number of VCSELs for different diffraction efficiencies in accordance with the present invention.

FIG. 23 illustrates the power coupling efficiency versus the number of VCSELs for $R_1$=0.95, $R_2$=0.95, and $R_c$=0. The coupling efficiency has a strong dependence on the number of VCSELs. As the number of VCSELs increases, the power coupling efficiency decreases. However, as expected, the coupling efficiency is much higher than that for $R_2$=0.35 as shown in FIG. 19. For η of 0.2, the coupling efficiency is 0.33 for 10 VCSELs. This is compared to 0.087 for $R_2$=0.35. Therefore, a 10 element VCSEL/waveguide grating system can produce the output power of 3.3 mW for η of 0.2. As a result, large coupling efficiency of the VCSEL into the waveguide can be realized using the waveguide grating structure with a highly reflective mirror.

Although waveguide coupling can be enhanced by using a highly reflective mirror on the backside of the waveguide structure, the power coupling efficiency is still relatively low. There are several ways to enhance the coupled output power. One possible method is to put a highly reflective coating on one of the facets of the waveguide structure, which is not the output port. As previously discussed, the coupled output powers into +z and −z directions are the same if all VCSEL inputs ($A_{in1}, A_{in2} \ldots$, and $A_{inN}$) are the same. That is, $A_{RN}=A_{LN}$. The idea is to use a highly reflective mirror to reflect back $A_{LN}$ to the waveguide. The output power coupled into +z direction can be enhanced by multiple reflections between the facet reflector and the waveguide gratings. The waveguide structure should be designed in such a way that the reflected light from the facet of the waveguide is added in phase with the guided modes in the waveguide.

Figure 24:
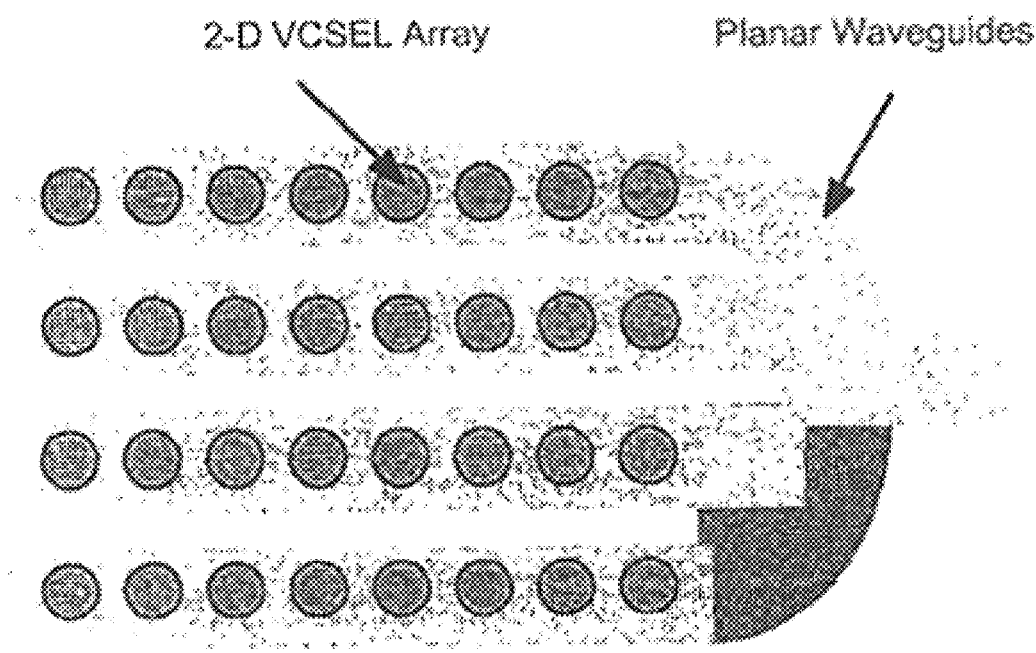
FIG. 24 is a diagram of a 2D array of a VCSEL/waveguide grating structure in accordance with the present invention.

The coupled output power can be also enhanced by using two dimensional (2D) arrays of the VCSEL/waveguide structure, as shown in FIG. 24. The planar waveguides for each row of VCSELs are connected together using a waveguide coupler. From the calculations, there is an optimum number of VCSELs that can be used to obtain a reasonable coupling efficiency. By increasing the array size, the output power can be greatly increased.

Integrate and Demonstrate a Hybrid Waveguide Structure

A hybrid waveguide structure was integrated with a diffractive optical interconnect element or DOIE array and a 1×5 VCSEL array. The single element coupling demonstration was crucial in determining the optimal waveguide structure. A series of waveguide structures were fabricated with various periods and grating depths. Grating depths and spacings were based on a spectral evaluation and characterization of candidate set of VCSELs. An 8×8 VCSEL ion implanted VCSEL array was used in the evaluation with a 1×5 array of elements selected. The spectral analysis was carried out at Opticomp Corporation (OCC) on selected VCSELs and the results were then forwarded to SMU where a candidate set of epitaxial gratings were determined and fabricated. Gratings were then bracketed around the mean average wavelength.

Figure 25:
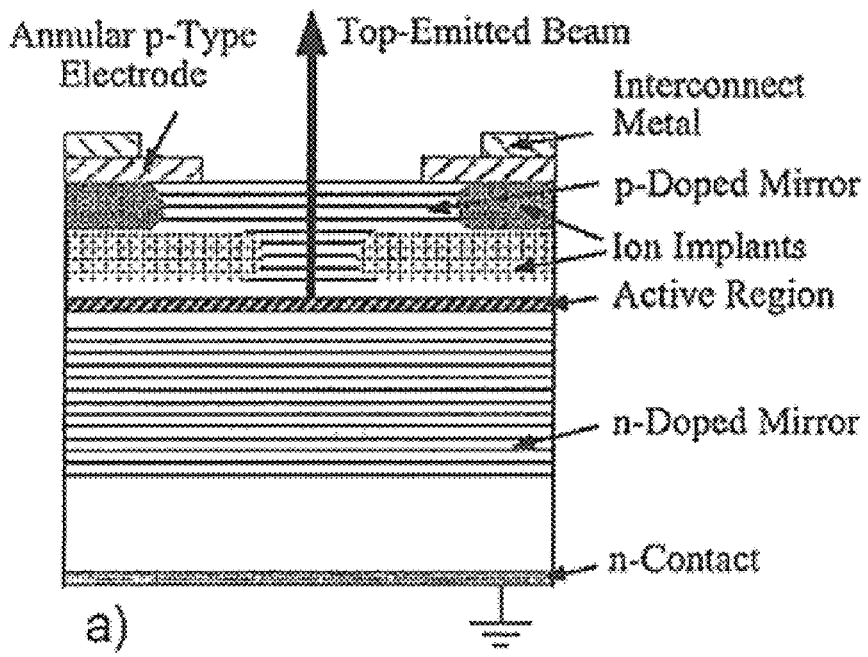
FIG. 25 is a diagram of an ion implanted VCSEL in accordance with the present invention.
Figure 26:
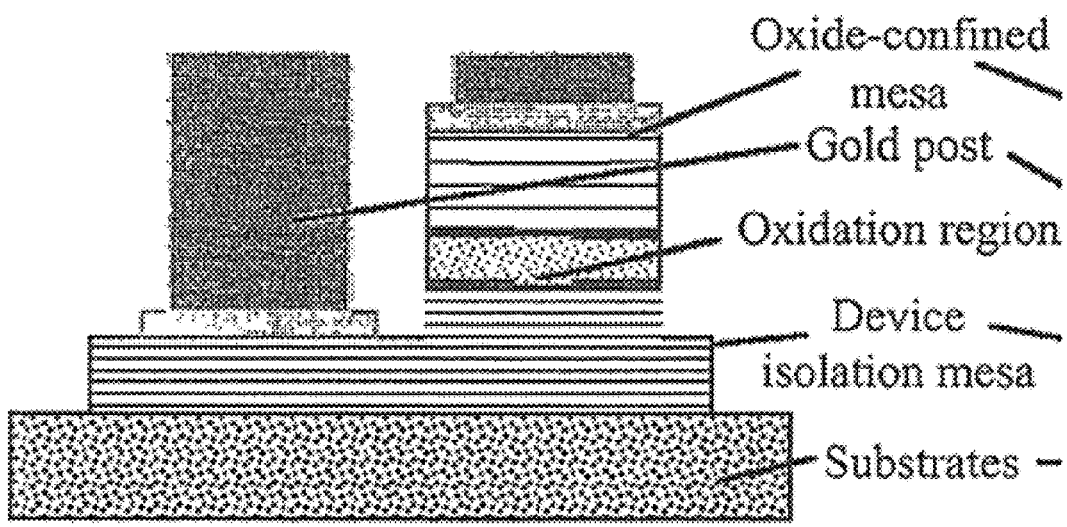
FIG. 26 is a diagram of an oxide confined VCSEL in accordance with the present invention.

FIG. 25 shows 850 nm VCSEL structures which were developed by OCC for optoelectronic integrated circuit (OEIC) integration. Arrays have been fabricated in 8×8 and 16×16 configurations. The lasers were processed from a GaAs/AlGaAs p-i-n distributed Bragg reflector (DBR) structure, which was grown by using metal organic chemical vapor deposition (MOCVD). The ion implanted VCSEL shown in FIG. 25 is a gain guided top-surface emitting device in which current confinement and electrical isolation of adjacent lasers is accomplished through hydrogen ion implantation. The oxide confined VCSEL structure (FIG. 26) uses flip-chip bonding to CMOS and subsequent substrate removal. The oxide confined VCSELs offer improved operational characteristics such as lower threshold or "turn on" currents and improved conversion efficiency. Although either device could be incorporated into the VCSEL/waveguide ad structure, a top emit-ting ion implanted VCSEL array was used for this demonstration.

Spectral Analysis of VCSELs

Figures 27, 28:
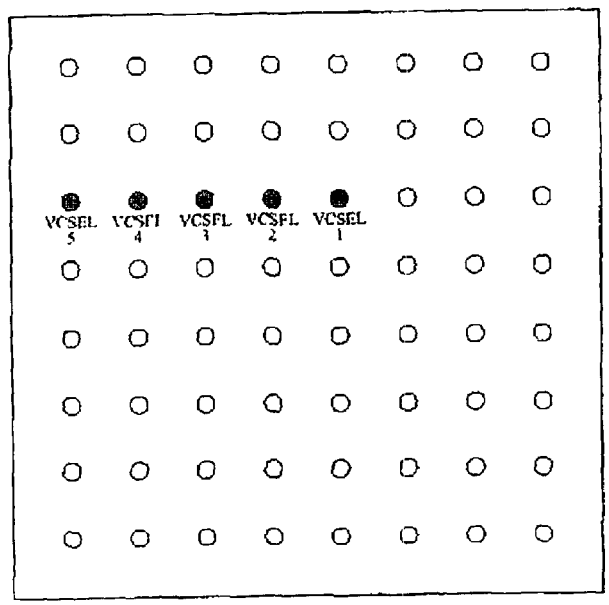
FIG. 27 is a diagram of an 8×8 VCSEL array in accordance with the present invention.
FIG. 28 is a diagram of voltages and currents applied to VCSELs in accordance with the present invention.

This spectral analysis was required in order to determine grating periods. After the data was recorded the results were submitted to SMU for grating period design. Spectral data measurements were obtained for a 1×5 linear array of VCSELs (FIG. 27). The lasers were all "powered-on" at the same time using a printed circuit board with eight channel CMOS driver chips. Output radiation was coupled into a multimode fiber and transmitted into a HP model 70950B optical spectrum analyzer.

FIG. 28 shows the voltages of (VddMOD) used to drive the eight channel CMOS driver chips and the output drive current recorded operate a single VCSEL. FIGS. 29 and 30, summarize the spectral results of the five element VCSEL array evaluation. FIG. 29 shows a comparison of the peak wavelengths at various voltages. The voltages refer to the VddMOD applied to the eight channel CMOS driver chips. FIG. 30 shows a comparison of the mean wavelengths at various voltages.

Grating Fabrication

Two waveguide epitaxial wafers were grown using molecular beam epitaxy (MBE) at Ohio State University by Robert Sacks. FIGS. 31 and 32 show the epitaxial structures. The epitaxial wafers are based on GaAs and AlGaAs semiconductor materials. An AlAs layer was first grown on a GaAs substrate. This AlAs layer serves as an etch-stop layer for the removal of the GaAs substrate. A thin GaAs layer was then grown and followed by an AlGaAs cladding layer. Finally, an AlGaAs waveguide core layer was grown. The thickness of the waveguide core was determined to be 0.5 $\mu$m and 8 $\mu$m for single mode and multi mode waveguides, respectively.

The GaAs epitaxial samples were cleaved into 10 samples. The samples were cleaned with acetone and rinsed with methanol and DI water and dried. The samples were then spin coated with a Shipley resist at 4500 rpm for 20 seconds and then softbaked for 90 seconds. The holographic grating fabrication process at SMU which was modified from a previous sequence [Evans, Carson, Hammer, Butler, Grating Surface Emitting Lasers, Academic Press, New York, 1993; Heflinger, Kirk, Corero, and Evans, Proceeding of SPIE, Vol. 269, 1981] comprises splitting a laser beam into two beams which are recombined at an angle, producing an interference pattern which is recorded in the photoresist. The light source used in this holographic process is an ultraviolet argon ion laser with an emission wavelength of 351.1 nm. The beam is spatially filtered, expanded using 4-inch diameter optics, and then collimated. By adjusting the angle between the two beams, the period of the resulting standing wave can be adjusted from ~180 nm to >1000 nm. After exposure, the wafer containing the photoresist is developed and the resulting photoresist grating pattern is replicated in the wafer surface using a dry etching process using a reactive ion etcher. The dry etching process does not limit the orientation of the device relative to crystal planes. It has several advantages over other processing techniques such as uniformity, control, and the capability for increased grating depths.

Figures 33, 34:
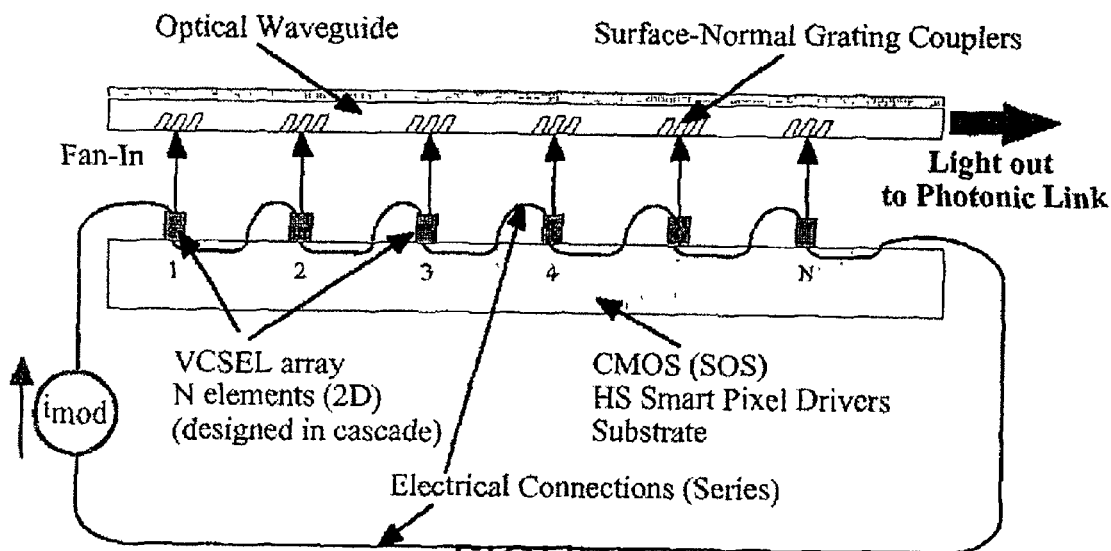
FIG. 33 is a diagram of a series of grating pitches in accordance with the present invention.
FIG. 34 is a diagram of a cascade VCSEL array coupled into an optical waveguide in accordance with the present invention.

The samples were placed in an oxygen plasma ash to remove any remaining photoresist. The samples were lapped and edges cleaved for ease of evaluation and coupling. Gratings were fabricated with the following periods as shown in FIG. 33. The pitch was varied every 20 Å, in order to bracket the optimal performance given a specific λ of 44.8 nm.

Testbed

A testbed was fabricated to evaluate the waveguide grating structures. The testbed used a specialized PCB board which contains integrated laser drivers and filtering components to drive VCSEL arrays. The output radiation was then collimated with an diffractive optical interconnect element (DOIE). The DOIE was mounted to a carrier and mounted to a multiaxial positioner. The collimated laser beam was incident on the waveguide. The VCSELs were set to 5.0 V. A 400× microscope was placed to examine the cleaved edge of the waveguide. The beam was incident on the waveguide ~1 mm from the edge of the waveguide. A CCD camera was placed so as to resolve the microscope image. All gratings were taken at the same power levels and angular positions.

The waveguides were attached to a glass slide and mounted. Incident VCSEL radiation was positioned at 500 mm, 1.5 $\mu$m, and 2.5 mm. An image was then recorded at each distance for evaluation.

Results

Ten waveguide gratings were evaluated (OSU-884-1: OSU-884-10). The grating OSU-884-10 shows the best waveguide results. The grating periods were not optimized for the OCC VCSEL. The output VCSEL light is faintly visible to the CCD camera in both photos. Gratings OSU-884-1:9 show markedly poor results due to the fact that not enough light could be coupled. However, the OSU-884-10 grating demonstrates that waveguiding is being accomplished through the displayed increase in intensity. The OSU-884-10 grating shows the corner of the waveguide, while the OSU-884-8 grating shows the middle of the waveguide. The OSU884-10 grating also shows scattering at the cleaved interface due to surface imperfections. The OSU-884-9 grating shows a series of the same grating with a different beam position. All of the samples were tested at the same positions and VCSEL power levels. It was determined from these results that another set of waveguides should be generated with grating pitches 100 Å beyond the grating spacing of 2493.2 Å. This will further confirm which gratings are optimally suited for the OCC VCSEL array.

Applications

Photonic Sources

A well known approach to increase the performance in an RF photonic link is to use the method of cascading lasers [C. Cox, "RF Photonic Testbed and Direct Modulation of Cascaded Laser," MURI on RF Photonic Materials and Devices, Review, Oct. 22, 1998] when implementing direct modulation. Laser relative intensity noise (RIN) dominates over other laser noises and must be minimized. The method of cascading lasers increases the signal power for a given current linearly while adding noise sources orthogonally. For the direct modulation topology, the gain in an optical link is determined by several parameters:

$$G \propto \eta_L^2 L^2 \eta_D^2$$

where $\eta_L$ is the RF-to-optical conversion efficiency (laser slope efficiency); L is the total loss in the fiber link; and $\eta_D$ is the optical-to-RF conversion efficiency (detector efficiency) at the receiver end. The noise figure is proportional to $1/\eta_L^2$.

Figure 35:
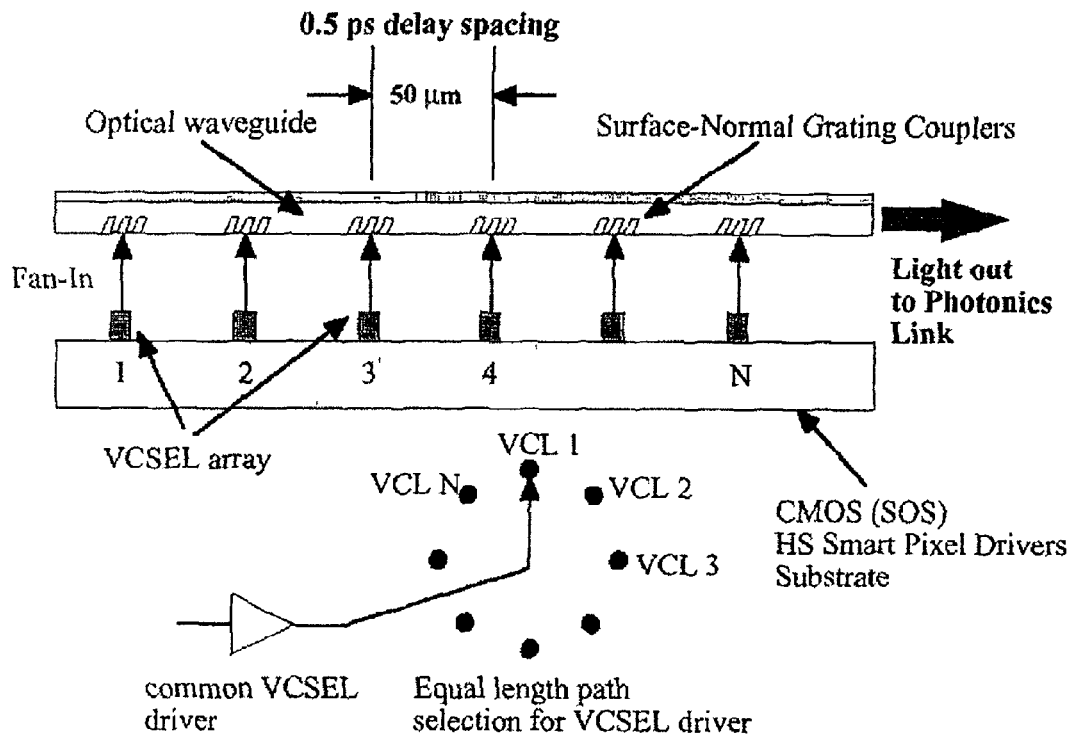
FIG. 35 is a diagram of a VSCEL array on a smart pixel substrate with a common driver and equal path length delays to the VSCEL in accordance with the present invention.

A method is provided which utilizes a VCSEL cascade coupled to a waveguide as a hybrid structure (FIG. 34). The system decreases RIN and increases power. The VCSEL array outputs are collimated with a DOIE lens and coupled through surface-normal grating couplers to generate the optical source. The VCSELs are flip-chip bonded to a silicon on sapphire (SOS) CMOS smart pixel array in order to drive the lasers at high speeds. The cascade VCSEL/waveguide may be coupled to a single mode fiber using V-groove methods for attachment High Resolution Time Delay for RADAR Beam Forming Another major challenge in RF photonics is the generation of high resolution (0.5 ps) reliable, time delays for RADAR beam forming [Private Communication with W. M. Miceli, ONR, September, 1998]. Current approaches that utilize different lengths of fiber are cumbersome for military applications. A more efficient solution uses a VCSEL/ waveguide with large fan-in to achieve a reliable time delay for RADAR beam forming (FIG. 35). Given the index of refraction of a semiconductor waveguide is ~3.3, the required VCSEL spacing can be obtained by multiplying the speed of light in the waveguide by the required time delay ($300\times10^6/3.3*0.5\times10^{-12}$). This gives the required VCSEL spacing of 50 µm in order to achieve a time delay of 0.5 ps. If the VCSELs are flip-chip bonded onto SOS CMOS smart pixels, the VCSEL output signals can be simultaneously produced, which will cause a reliable time delay within the optical waveguide. FIG. 34 illustrates a Cascade VCSEL array coupled into an optical waveguide. SOS technology may currently be designed for 5 GHz applications. With future reductions in gate widths, 10 GHz applications can be expected.

EDFA 980 nm VCSEL/Waveguide Pump Arrays

By coupling one-dimensional and two-dimensional VCSEL arrays into a waveguide, the power level at the optical output of the waveguide may ideally approach the sum of all VCSEL inputs. This is attractive for a number of applications which involve coupling multiple VCSEL sources into a single mode fiber. The application of free-space optical interconnect solutions for the coupling of single mode lasers into a single mode fiber is tenuous. However, the superposition of VCSEL emission sources utilizing optical waveguides appears attractive especially when coupling into a single mode fiber is required.

Figure 36:
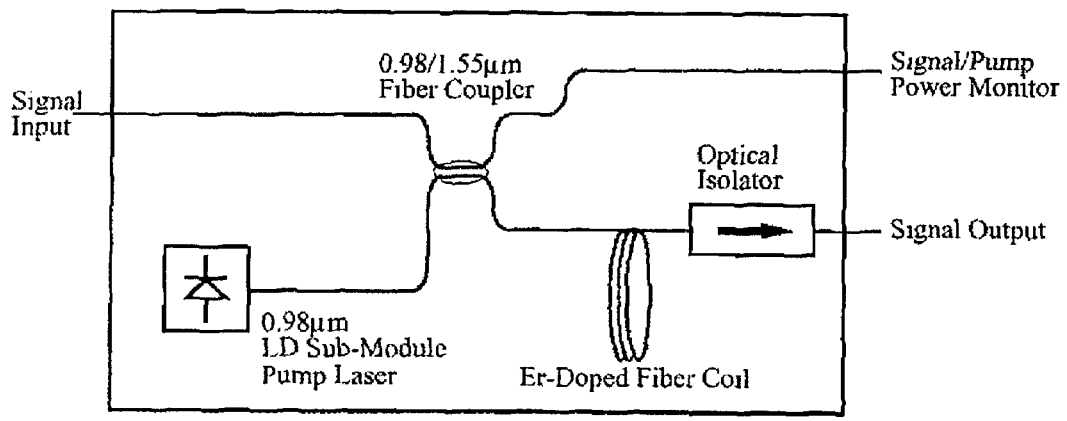
FIG. 36 is a diagram of an EDGA pump module in accordance with the present invention.

Of particular interest is the EDFA pump laser. A schematic drawing of a complete EDFA pump module with the laser source is shown in FIG. 36. A partial list of EDFA specifications is summarized in FIG. 37 [Private discussion: Dr. Steve Bashden, OptiGain, October, 1998]. The 200 mW power levels are currently satisfied with single stripe edge-emission devices. Multiple VCSELs connected in parallel, in one or two dimensions as shown in FIG. 38, may potentially achieve similar or higher power levels. For example, an array geometry of 10×10 VCSELs each having an output power of 2 mW could theoretically achieve 200 mW output into the fiber through the waveguide, assuming 100% coupling efficiency. Regarding the physical size, if the VCSELs are spaced on 50 mm centers, the entire array would occupy a space 500 µm×500 µm to achieve 200 mW. Initial calculations indicate that the hybrid waveguide configuration can achieve 65% coupling efficiency. This would require more power from each VCSEL (~3 mW) or an additional 30 VCSELs. Substantially higher power levels should be achievable out of the waveguide. Initial calculations indicate that the 1550 nm single-mode fiber (multimode at 978) has a capacity of 500 mW before undesired nonlinear effects become significant.

This pump source configuration potentially offers increased reliability. In general, ion implanted VCSELs demonstrate >$1\times10^6$ hours mean time to failure (MTTF)[R. A. Morgan et al., "Reliability study of 850 nm VCSELs for data communications," 34th Annual Proceedings of International Reliability Physics Symposium, pp. 203–10, 1996]. Should one or more VCSELs stop lasing, the decrease in output power is not significant. In fact, several devices would have to fail before the amplifier performance is degraded below the required specifications. This "slow" failure mode would not be considered catastrophic. Consequently, significant "down time" may be avoided and the pump laser replacement may be scheduled. Infant mortality and yield are also substantially improved thereby reducing cost. For example, if 10% of the VCSELs do not meet the required specifications when fabricated, the array may still be used. Another advantage is increased thermal stability. VCSELs have approximately a 3:1 decrease in thermal drift compared to stripe designs. On the basis of pump wavelength and required tolerances, VCSELs can be utilized as 980 nm pump sources for conventional EDFAs.

On-Chip/Chip-to-Chip Communications

Figure 39:
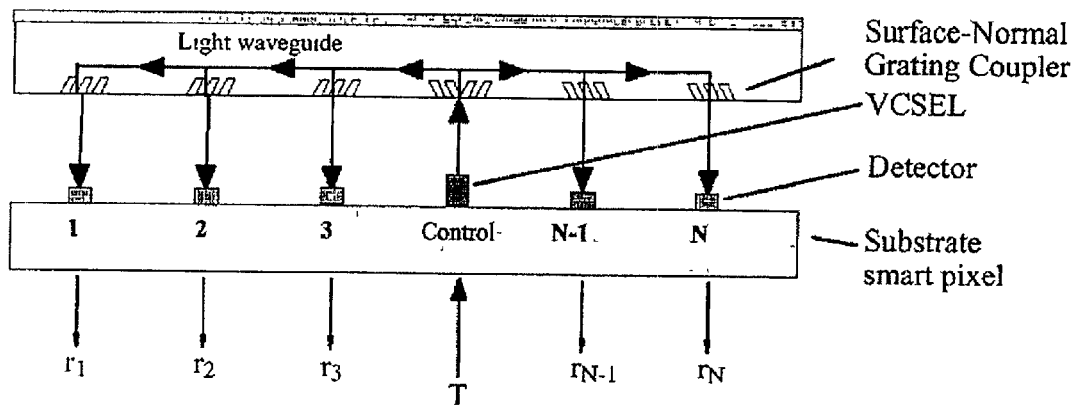
FIG. 39 is a diagram of a one-point-to-many points fan-out utilizing VCSEL/waveguide interconnects in accordance with the present invention.
Figure 40:
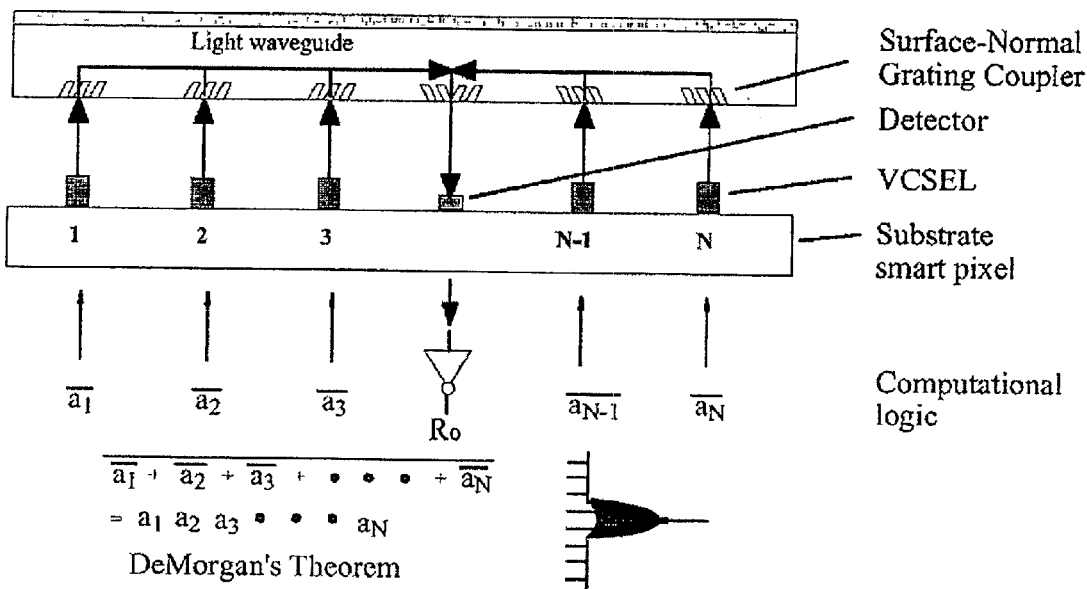
FIG. 40 is a diagram of a many-points-to-one point fan-out utilizing VCSEL/waveguide interconnects and smart pixel devices in accordance with the present invention.
Figure 41A:
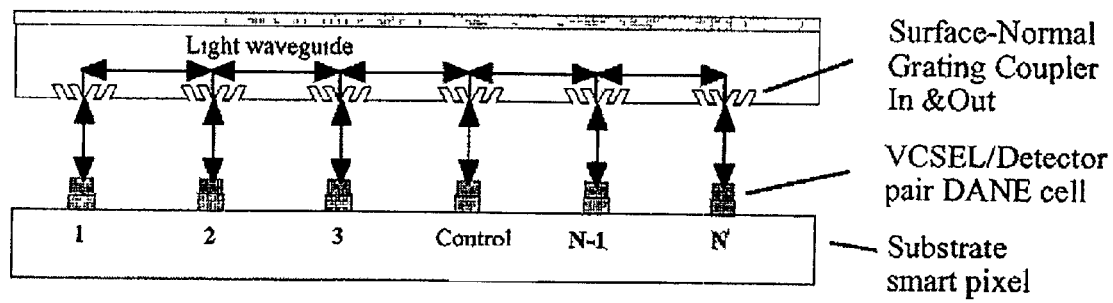
FIG. 41A is a diagram of a global waveguide optical interconnects for many-points-to-many points fan-out/fan-in utilizing VCSEL/waveguide interconnects and smart pixel devices in accordance with the present invention.
Figure 41B:
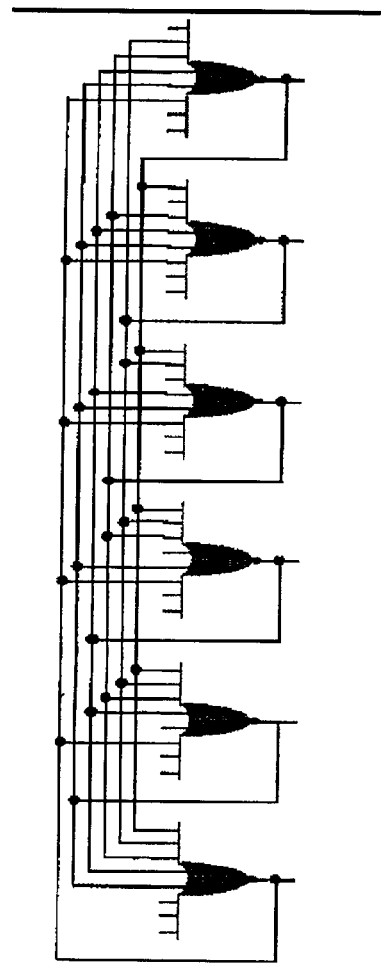
FIG. 41B is a schematic diagram of an equivalent logic circuit demonstrating feedback of the global waveguide optical interconnects of FIG. 41A.

The VCSEL/waveguide structure can be used in commercial applications which implement fan-out and fan-in architectures (FIGS. 39, 40, 41A, 41B). Using a one-point-to-many-points architecture (fan-out), clock signals can be distributed on a single chip or between chips (FIG. 39). Logic NOR gates can be realized with the many-points-to-one-point architecture: fan-in (FIG. 40). By combining fan-in and fan-out in the same waveguide a many-points-to-many-points architecture can be achieved (FIGS. 41A & 41B). This fan-in/fan-out represents a programmable gate array which can implement feedback.

On-Chip Data Distribution (e.g. Clock) and Chip-to-Chip Interconnect (Fan-Out)

Similar utilization of fan-out, as depicted in FIG. 39, has been proposed for VCSEL/waveguide interconnects for on-chip data/clock distribution and die-to-die interconnects for board level or MCM (multi-chip-module) level interconnects [Chen et al., "1-to-12 surface normal three-dimensional optical interconnects," APL, Vol. 63, No. 14, October 1993; Chen et al., "Equal Fanout Optical Interconnects Using Dupont Photopolymer Films," SPIE Vol. 3005, February 1997.; Distribution," IEEE PTL, Vol. 8, No. 8, pp. 1038–40, August 1996] This configuration represents a one-to-many interconnect scheme. It is predicted that the fan-out VCSEL/waveguide interconnect systems will represent the next generation of commercialized optoelectronic interconnect products. By comparison, today's commercially available "state-of-the-art" VCSEL/waveguide interconnect structures, such as the POLO interconnect developed under DARPA sponsorship, demonstrate a one-point-to-one-point parallel interconnect (8–32 channels).

Processor/Memory I/O and Crossbar Switching (Fan-In)

Figure 42:
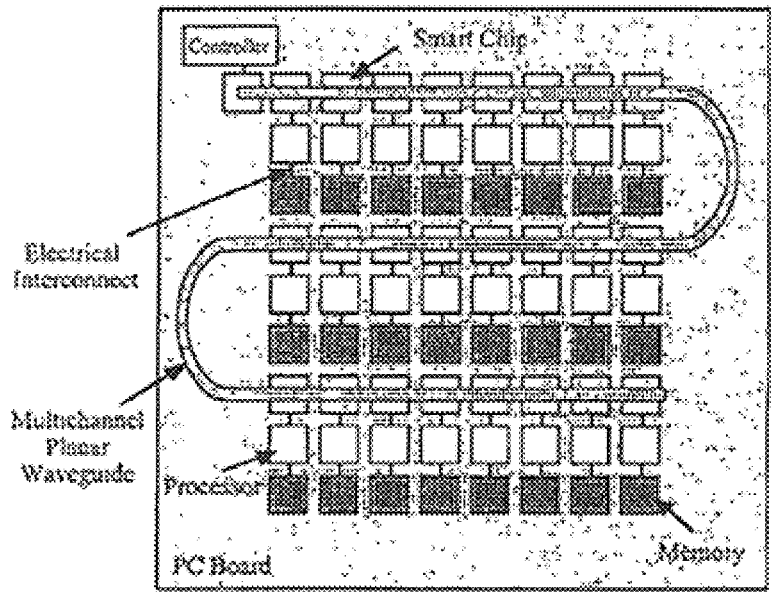
FIG. 42 is a diagram of a processor/memory interconnect via parallel optical waveguide bus configured as a crossbar switch in accordance with the present invention.

The many-point-to-one-point fan-in topology, which is shown in FIG. 40, may in fact represent the next architectural evolution after the one-point-to-many-points configuration. This is referred to, for digital signals, as a "smart" interconnect. If the input signals or bits are represented in complementary notation, and the output is inverted, then the system is effectively an N-input AND gate by DeMorgan's Theorem [OptiComp patent" Global Interconnect Architecture for Optical Computer," U.S. Pat. No. 5,297,068, 1994.; OptiComp patent "General Purpose Optical Computer, "U.S. Pat. No. 5,267,183; 1993.; OptiComp patent "Combinatorial Logic-Based Optical Computing Method", U.S. Pat. No. 4,864,524, 1989.]. Consider the parallel optical bus configuration shown in FIGS. 42, and 43. Utilizing the fan-in only optical scheme, the system may be configured as a non-blocking, multichannel Gigabit Ethernet crossbar, which requires a separate controller channel.

Figure 43:
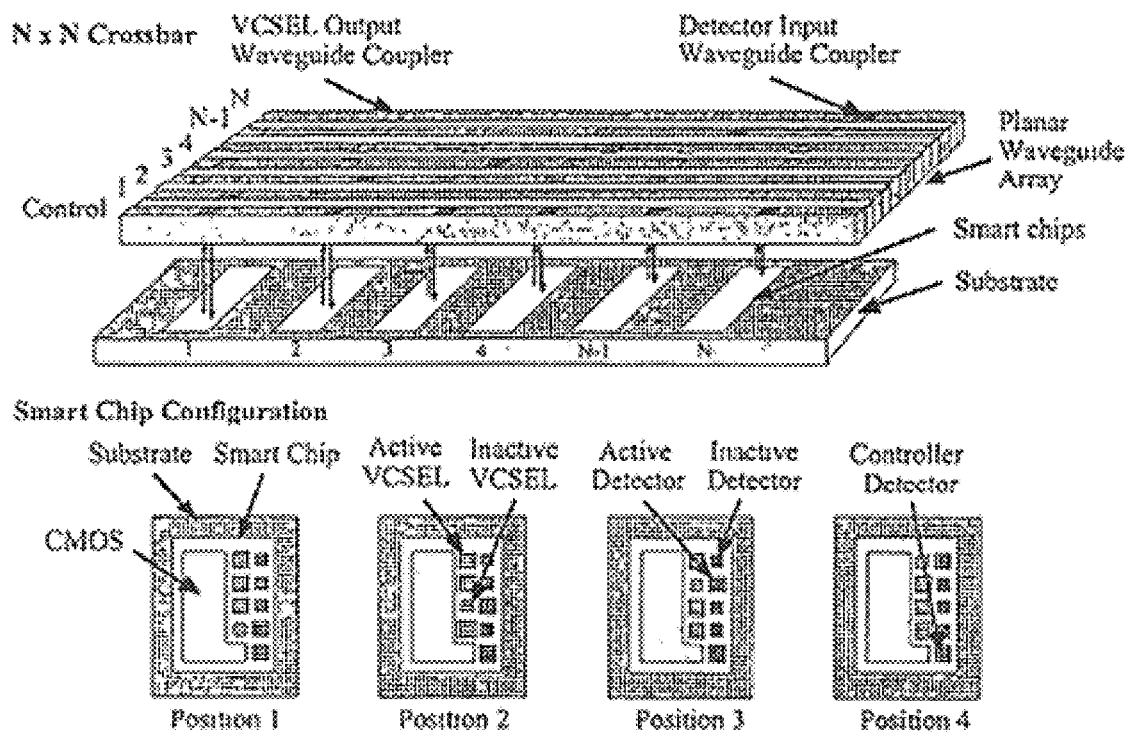
FIG. 43 is a diagram of a smart pixel set utilized in a parallel crossbar in accordance with the present invention.

Each processor/memory subsystem has a dedicated receiver and its own dedicated waveguide channel as shown in FIG. 43. All waveguide channels cross over each processor/memory smart pixel chip. Each processor memory smart pixel chip has N-transmitter VCSELs, one for each waveguide channel except for the receive and the control channel. In this configuration, the controller can route the signal from any "transmit" processor/memory element to any "receive" processor/memory element. Note that none of the receivers fully utilize DeMorgan's Theorem due to the fact that there is only one signal on each channel at any time.

Fully Non-Blocking Gigabit Ethernet Crossbar Anarchy (Global Fan-In/Fan-Out)

The complete fan-in/fan-out system, shown in FIGS. 41A & 41B, configures the crossbar to be able to become "controller free." This architecture could be configured as a fully non-blocking gigabit Ethernet crossbar anarchy. Each channel senses every other channel and effectively waits for a "go" signal. Many other applications may be implemented with the global waveguide interconnect system, which is effectively a programmable gate array with feedback.

Summary

Resonant cavity enhanced VCSEL/waveguide grating coupler was proposed to achieve coherent high-power light sources. The surface-normal grating is utilized to achieve the desired coupling light from the VCSEL into the waveguide. The waveguide structures were based on GaAs and AlGaAs semiconductor materials. They were designed for both singlemode and multi-mode operations at 850 nm.

A mathematical model has been presented to describe diffraction into a waveguide from a normally incident light from the VCSEL. From the calculations, it was found that the coupling efficiency can be considerably enhanced by using a substrate mirror. The coupling efficiency has a pronounced dependence on the reflectivity of the substrate mirror. The substrate mirror redirects light emitted toward the substrate, thereby increasing the coupling into the waveguide. Therefore, the waveguide grating structure with a highly reflective mirror allows the use of low diffraction efficiency for large coupling efficiency of the VCSEL into the waveguide.

The present invention has been described above with reference to a several different embodiments. However, those skilled in the art will recognize that changes and modifications may be made in the above described embodiments without departing from the scope of the invention. Furthermore, while the present invention has been described in connection with a specific processing flow, those skilled in the are will recognize that a large amount of variation in configuring the processing tasks and in sequencing the processing tasks may be directed to accomplishing substantially the same functions as are described herein. These and other changes and modifications which are obvious to those skilled in the art in view of what has been described herein are intended to be included within the scope of the present invention.

What is claimed is:

1. An optical coupler comprising:
   first and second mirrors, wherein the first mirror is positioned with respect to the second mirror so that a resonant cavity is defined between them;
   a waveguide structure positioned in the resonant cavity and including a surface-normal grating structure; and
   wherein a thickness of the resonant cavity is selected so that a phase matching condition is satisfied for resonance in the resonant cavity.

2. The optical coupler of claim 1 wherein at least one of the first and second mirrors is formed from a structure in an optoelectronic device.

3. The optical coupler of claim 1 wherein at least one of the first and second mirrors is formed from a semiconductor layer.

4. The optical coupler of claim 1 wherein at least one of the first and second mirrors is formed as a semiconductor distributed bragg reflector.

5. The optical coupler of claim 1 wherein at least one of the first and second mirrors is formed as a dielectric distributed bragg reflector.

6. The optical coupler of claim 1 wherein at least one of the first and second mirrors is a mirror in a vertical cavity surface emitting laser (VCSEL) structure.

7. The optical coupler of claim 1 wherein at least one of the first and second mirrors is a mirror in a photodetector structure.

8. The optical coupler of claim 1 wherein the first and second mirrors and waveguide structure are formed in a hybrid structure.

9. The optical coupler of claim 1 wherein the first and second mirrors and waveguide structure are formed in a monolithic structure.

10. The optical coupler of claim 1 wherein the surface-normal grating structure is shaped so that first order modes of light incident upon the surface-normal grating structure are coupled into the waveguide while zero-order modes are reflected out into the resonant cavity and reflected by the mirror.

11. An optical coupler comprising
    a vertical cavity surface emitting laser diode (VCSEL) structure having a mirror and an output;
    a mirror positioned opposite the output of the VCSEL structure and facing the mirror of the VCSEL; and
    a waveguide structure having a surface-normal grating structure positioned between the VCSEL and the mirror.

12. The optical coupler of claim 11 further including collimating optics positioned between the VCSEL and the waveguide for directing light emitted from the VCSEL into the waveguide.

13. The optical coupler of claim 11 wherein the mirror of the VCSEL and the mirror define a resonant cavity, and the surface-normal grating structure is shaped so that first order modes of light incident upon the surface-normal grating structure are coupled into the waveguide while zero-order modes are reflected out into the resonant cavity and reflected by the mirror.

14. The optical coupler of claim 11 wherein the surface-normal grating structure is shaped so that a portion of light which is incident normal to a surface of the grating structure is coupled horizontally into the waveguide and a different portion of the normally incident light is reflected into a resonant cavity formed between the mirror of the VCSEL and the mirror and so that multiple reflections occur within the resonant cavity, and superposition occurs of the light coupled into the waveguide.

15. The optical coupler of claim 14 wherein emitted the light coupled into the waveguide is emitted from the waveguide through an edge of the waveguide.

16. The optical coupler of claim 11 wherein the mirror is highly reflective.

17. The optical coupler of claim 11 wherein the mirror is formed on a surface of the waveguide, and the surface-normal grating is formed on a different surface of the waveguide which is opposite the surface on which the mirror is formed.

18. An optical coupler comprising
    a photodetector structure having a mirror and an input;
    a mirror positioned opposite the input of the photodetector structure and facing the mirror of the photodetector structure; and
    a waveguide structure having a surface-normal grating structure positioned between the photodetector and the mirror.

19. The optical coupler of claim 18 wherein the photodetector is a resonant cavity photodetector.

20. The optical coupler of claim 18 wherein the photodetector is a non-resonant photodetector.

21. The optical coupler of claim 18 further including collimating optics positioned between the photodetector and the waveguide for directing light emitted from the waveguide into the photodetector.

22. An optical coupler comprising
    a substrate;
    a first mirror layer formed on the substrate;

a waveguide layer formed on the first mirror layer;

a surface-normal grating formed on the waveguide layer; and a photodetector structure formed over the surface-normal grating, wherein the photodetector structure includes a second mirror layer which is positioned to reflect light from the surface-normal grating.

23. The optical coupler of claim 22, wherein the surface-normal grating is etched into the waveguide layer, and the photodetector is formed on the surface-normal grating using epitaxial regrowth.

24. The optical coupler of claim 22, wherein the photodetector structure is formed on a separate substrate, and further wherein, the photodetector structure is wafer-bonded to the surface-normal grating.

25. An optical coupler comprising a substrate;

a first mirror layer formed on the substrate;

a waveguide layer formed on the first mirror layer;

a surface-normal grating formed on the waveguide layer; and a vertical cavity surface emitting laser diode structure formed over the surface-normal grating, wherein the vertical cavity surface emitting laser diode structure includes a second mirror layer which is positioned to reflect light from the surface-normal grating.

26. The optical coupler of claim 22, wherein the surface-normal grating is etched into the waveguide layer, and the vertical cavity surface emitting laser diode is formed on the surface-normal grating using epitaxial regrowth.

27. The optical coupler of claim 22, wherein the vertical cavity surface emitting laser diode structure is formed on a separate substrate, and further wherein, the vertical cavity surface emitting laser diode structure is wafer-bonded to the surface-normal grating.

28. An optical coupler comprising a first substrate;

a first mirror layer formed on the first substrate;

a waveguide layer formed on the first mirror layer;

a surface-normal grating formed by etching the waveguide layer;

a second substrate;

a vertical cavity surface emitting laser diode structure formed on the second substrate, wherein the vertical cavity surface emitting laser diode structure includes a second mirror layer which is positioned to reflect light; and wherein the vertical cavity surface emitting laser diode structure is wafer-fused onto the surface-normal grating structure so that light from the vertical cavity surface emitting laser diode structure is reflected into the surface-normal grating, so that air is enclosed in the surface-normal grating structure.

29. An optical coupler comprising a first substrate;

a first mirror layer formed on the first substrate;

a waveguide layer formed on the first mirror layer;

a surface-normal grating formed by etching the waveguide layer;

a second substrate;

a photodetector structure formed on the second substrate, wherein the photodetector structure includes a second mirror layer which is positioned to reflect light; and wherein the photodetector structure is wafer-fused onto the surface-normal grating structure so that light from the surface-normal grating is reflected into the photodetector structure, and so that air is enclosed in the surface-normal grating structure.

30. An optical coupler comprising a substrate;

a first mirror layer formed on the substrate;

a waveguide layer formed on the first mirror layer;

a surface-normal grating formed on the waveguide layer;

a vertical cavity surface emitting laser diode structure formed on a portion of the surface-normal grating, wherein the vertical cavity surface emitting laser diode structure includes a second mirror layer which is positioned to reflect light from the surface-normal grating; and a photodetector structure formed over a different portion of the surface-normal grating, wherein the photodetector structure includes a second mirror layer which is positioned to reflect light from the surface-normal grating.

31. An optical transceiver including a substrate;

a first mirror layer formed on the substrate;

a waveguide layer formed on the first mirror layer;

a surface-normal grating formed on the waveguide layer;

a transmitter comprising a vertical cavity surface emitting laser diode structure formed on a portion of the surface-normal grating, wherein the vertical cavity surface emitting laser diode structure includes a second mirror layer which is positioned to reflect light from the surface-normal grating; and a receiver comprising a photodetector structure formed over a different portion of the surface-normal grating, wherein the photodetector structure includes a second mirror layer which is positioned to reflect light from the surface-normal grating.

32. A multiplexer comprising a plurality of VCSELs with different wavelengths; and a waveguide, having a plurality of resonant cavity enhanced surface normal gratings, positioned to couple light from the plurality of VCSELs with different wavelengths into the waveguide, wherein each of the plurality of resonant cavity enhanced surface gratings has a shape such that each surface normal grating allows light from each of the plurality of VCSELs to be coupled to the waveguide only through a designated surface grating.

33. A demultiplexer comprising a plurality of photodetectors; and a waveguide, having a plurality of resonant cavity enhanced surface normal gratings, positioned to couple light of different wavelengths into the plurality of photodetectors, wherein each of the plurality of resonant cavity enhanced surface gratings has a shape such that each surface normal grating allows light of different wavelengths to be coupled to each of the plurality of photodetectors only through a designated surface grating.

* * * * *